(12) United States Patent
Lee

(10) Patent No.: US 10,726,932 B2
(45) Date of Patent: Jul. 28, 2020

(54) STORAGE DEVICE AND METHOD OF OPERATING THE SAME

(71) Applicant: SK hynix Inc., Gyeonggi-do (KR)

(72) Inventor: Un Sang Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/154,334

(22) Filed: Oct. 8, 2018

(65) Prior Publication Data

US 2019/0287635 A1   Sep. 19, 2019

(30) Foreign Application Priority Data

Mar. 13, 2018   (KR) .................. 10-2018-0029349

(51) Int. Cl.
| | | |
|---|---|---|
| *G11C 11/34* | (2006.01) | |
| *G11C 16/34* | (2006.01) | |
| *G11C 11/56* | (2006.01) | |
| *G11C 29/52* | (2006.01) | |
| *G11C 16/10* | (2006.01) | |

(52) U.S. Cl.
CPC ...... *G11C 16/3495* (2013.01); *G11C 11/5628* (2013.01); *G11C 16/102* (2013.01); *G11C 16/3404* (2013.01); *G11C 16/3459* (2013.01); *G11C 29/52* (2013.01)

(58) Field of Classification Search
CPC ............ G11C 16/3495; G11C 11/5628; G11C 16/102; G11C 16/3404; G11C 16/3459; G11C 29/52
USPC .................................................. 365/185.22
See application file for complete search history.

(56) References Cited

U.S. PATENT DOCUMENTS

| | | | | |
|---|---|---|---|---|
| 6,493,266 | B1* | 12/2002 | Yachareni | G11C 16/3404 365/185.22 |
| 8,081,517 | B2* | 12/2011 | Kim | G11C 16/3495 365/185.11 |
| 9,202,593 | B1* | 12/2015 | Magia | G11C 11/5628 |
| 2006/0291285 | A1* | 12/2006 | Mokhlesi | G11C 11/5628 365/185.18 |
| 2008/0205137 | A1* | 8/2008 | Yanagidaira | G11C 11/5628 365/185.03 |
| 2010/0103717 | A1* | 4/2010 | Lee | G11C 11/22 365/148 |
| 2012/0155182 | A1* | 6/2012 | Kim | G11C 11/5628 365/185.19 |
| 2012/0198290 | A1* | 8/2012 | Cho | G11C 16/12 714/708 |
| 2013/0088919 | A1* | 4/2013 | Kim | G11C 16/26 365/185.12 |

(Continued)

FOREIGN PATENT DOCUMENTS

| | | |
|---|---|---|
| KR | 1020100074706 | 7/2010 |
| KR | 1020130078973 | 7/2013 |
| KR | 1020140091839 | 7/2014 |

*Primary Examiner* — Viet Q Nguyen
(74) *Attorney, Agent, or Firm* — IP & T Group LLP

(57) ABSTRACT

A storage device includes a memory device configured to store program pulse information indicating whether the number of program pulses applied to selected memory cells during a program operation exceeds a reference value; and a memory controller configured to determine whether the probability of a growing defect occurring in the selected memory cells is present based on the program pulse information.

20 Claims, 16 Drawing Sheets

(56) References Cited

U.S. PATENT DOCUMENTS

| | | | |
|---|---|---|---|
| 2014/0269058 A1* | 9/2014 | Liu | G11C 11/5628 365/185.03 |
| 2015/0085593 A1* | 3/2015 | Mu | G11C 7/08 365/208 |
| 2016/0180956 A1* | 6/2016 | Cho | G11C 16/3459 365/185.21 |
| 2019/0198114 A1* | 6/2019 | Ben-Rubi | G11C 16/3459 |

* cited by examiner

STORAGE DEVICE AND METHOD OF OPERATING THE SAME

CROSS-REFERENCE TO RELATED APPLICATION

The present application claims priority under 35 U.S.C. § 119(a) to Korean patent application number 10-2018-0029349, filed on Mar. 13, 2018, which is incorporated herein by reference in its entirety.

BACKGROUND

1. Field of Invention

Various embodiments of the present disclosure generally relate to an electronic device, and more particularly, to a storage device and a method of operating the storage device.

2. Description of Related Art

Generally, a storage device is a device which stores data under control of a host device such as a computer, a smartphone, or a smartpad. The storage device may include a memory device configured to store data, and a memory controller configured to control the memory device. Memory devices are classified into volatile memory devices and nonvolatile memory devices.

A volatile memory device is a memory device in which data stored therein is lost when power is interrupted. Representative examples of the volatile memory device include a static RAM (SRAM), a dynamic RAM (DRAM), and a synchronous DRAM (SDRAM).

A nonvolatile memory device is a memory device which retains data stored therein even when power is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM).

SUMMARY

Various embodiments of the present disclosure are directed to a storage device capable of detecting a region where the probability of occurrence of a growing defect is present, and a method of operating the storage device.

An embodiment of the present disclosure may provide for a memory device including: a memory cell array including a plurality of memory cells; a peripheral circuit configured to perform a program operation on selected memory cells among the plurality of memory cells; and a program pulse information generating unit configured to generate program pulse information indicating whether a number of program pulses applied to the selected memory cells during the program operation has exceeded a reference value.

An embodiment of the present disclosure may provide for a method for operating a memory controller, including: providing a program command corresponding to a program operation to a memory device; providing a status read command to the memory device when a preset time passes after the program command is provided; receiving a status read response output from the memory device in response to the status read command; and determining whether a probability of a growing defect occurring in a memory region on which the program operation has been performed is present, based on program pulse information included in the status read response.

An embodiment of the present disclosure may provide for a storage device including: a memory device configured to store program pulse information indicating whether a number of program pulses applied to selected memory cells during a program operation exceeds a reference value; and a memory controller configured to determine whether a probability of a growing defect occurring in the selected memory cells is present based on the program pulse information.

An embodiment of the present disclosure may provide for a memory system including: a memory device suitable for generating an application number of program pulses during a program operation to a first memory block; and a controller suitable for: controlling the memory device to perform a read operation to the first memory block when the application number is greater than a threshold; controlling, when the read operation is successful, the memory device to perform only a read operation to the first memory block thereafter; and controlling, when the read operation fails, the memory device to perform the program operation again to a second memory block and not to store data in the first memory block thereafter.

DETAILED DESCRIPTION

Figure 1:
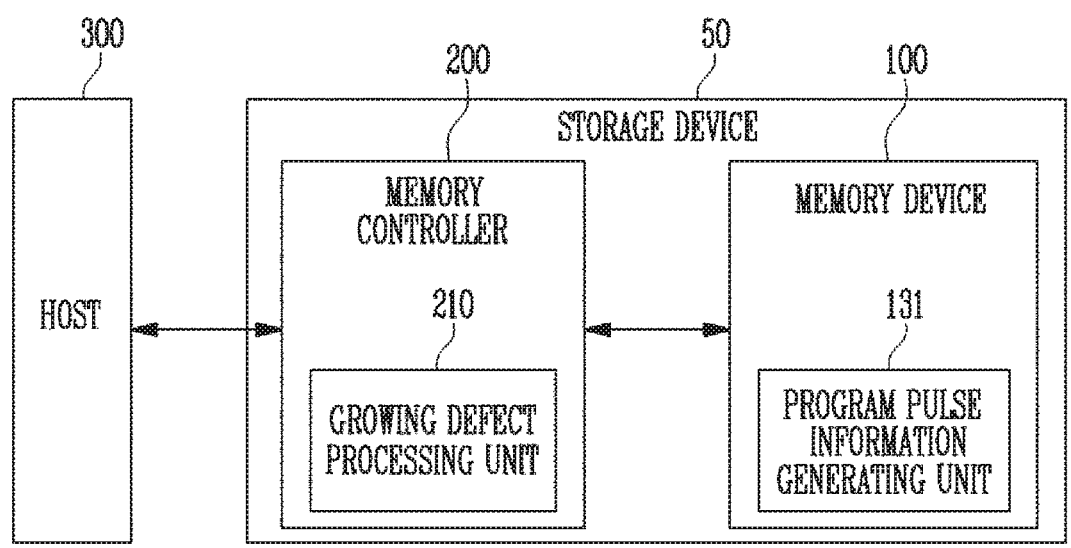
FIG. 1 is a diagram illustrating a storage device in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to describe various components, but those terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, "and/or" may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a storage device 50 in accordance with an embodiment of the present disclosure.

Referring to FIG. 1, the storage device 50 may include a memory device 100, a memory controller 200, and a host 300.

The storage device 50 may be a device configured to store data under control of the host 300 such as a cellular phone, a smartphone, an MP3 player, a laptop computer, a desktop computer, a game machine, a TV, a tablet PC, or an in-vehicle infotainment system.

The storage device 50 may be configured of any one of various kinds of storage devices depending on a host interface, which is a communication system with the host 300. For example, the data storage device 50 may be configured of any one of various kinds of storage devices such as an SSD, MMC, eMMC, RS-MMC, or micro-MMC type multimedia card, an SD, mini-SD, micro-SD type secure digital card, a universal serial bus (USB) storage device, a universal flash storage (UFS) device, a personal computer memory card international association (PCMCIA) card type storage device, a peripheral component interconnection (PCI) card type storage device, a PCI-express (PCI-E) type storage device, a compact flash (CF) card, a smart media card, and a memory stick.

The storage device 50 may be manufactured in the form of any one of various package types. For instance, the storage device 50 may be manufactured in the form of any one of various package types such as a package on package (POP) type, a system in package (SIP) type, a system on chip (SOC) type, a multi-chip package (MCP) type, a chip on board (COB) type, a wafer-level fabricated package (WFP) type, and a wafer-level stack package (WSP) type.

The memory device 100 may store data therein. The memory device 100 may operate under control of the memory controller 200. The memory device 100 may include a memory cell array including a plurality of memory cells configured to store data therein. The memory cell array may include a plurality of memory blocks. Each memory block may include a plurality of memory cells. Each memory block may include a plurality of pages. In an embodiment, each page may be the unit of sorting data to the memory device 100 or reading stored data from the memory device 100. Each memory block may be the unit of performing an erase operation.

The memory blocks may be divided into a free block, an open block, and a closed block (write-complete block). The free block may be an empty block in which no data is stored. The open block may be a memory block in which data has been stored in only a portion thereof. The closed block may be a memory block in which data has been stored in the entire region thereof.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), or a spin transfer torque random access memory (STT-RAM). In this specification, for the sake of explanation, it is assumed that the memory device 100 is a NAND flash memory.

In an embodiment, the memory device 100 may be embodied in a three-dimensional array structure. The present disclosure may be applied not only to a flash memory in which a charge storage layer is formed of a conductive floating gate (FG), but also to a charge trap flash (CTF) memory in which a charge storage layer is formed of an insulating layer.

The memory device 100 may receive a command and an address from the memory controller 200 and access a region of the memory cell array that is selected by the address. In other words, the memory device 100 may perform an operation corresponding to the command on the region selected by the address. For example, the memory device 100 may perform a write (program) operation, a read operation, and an erase operation. During a program operation, the memory device 100 may program data to a region selected by an address. During a read operation, the memory device 100 may read data from a region selected by an address. During an erase operation, the memory device 100 may erase data from a region selected by an address.

The program operation may be an operation of increasing threshold voltages of memory cells to a threshold voltage corresponding to a target programmed status depending on data to be stored.

The program operation may be performed by iterating a program voltage application step of applying a program pulse to a selected word line coupled with memory cells to be programmed, and a program verify step of applying a verify voltage to the selected word line to determine whether the threshold voltages of the memory cells to be programmed have reached the threshold voltage corresponding to the target programmed status. At the program verify step, if the threshold voltages of the memory cells to be programmed have reached the threshold voltage corresponding to the target programmed status, the target memory cells may pass the program verification. If the threshold voltages of the memory cells to be programmed have not reached the threshold voltage corresponding to the target programmed status, the target memory cells may fail the program verification.

One program voltage application step and one program verify step may form a single program loop. Therefore, the program operation may be performed by iteration of a plurality of program loops. Each time the number of performed program loops is increased, the voltage level of the program pulse may be increased. Particularly, a scheme in which the voltage level of the program pulse is increased by a preset step voltage each program loop iteration is referred to as "incremental step pulse program (ISPP) scheme".

The memory device 100 may perform the program operation by iterating a plurality of program loops until target cells pass the program verify step.

The program operation of the memory device 100 may be performed on a page basis. A plurality of memory cells coupled to the same word line may form a single page.

In accordance with an embodiment of the present disclosure, a maximum number of program pulses may be predetermined to be applied to a selected word line for a program operation on a single page. In this specification, the maximum number of program pulses to be applied to a selected word line is defined as a maximum program pulse count. During a program operation, if target memory cells have not passed the program verify step despite the maximum program pulse count of the applied program pulses, the memory device 100 may determine that the program operation has failed.

In an embodiment, the memory device 100 may include a program pulse information generating unit 131. When the program operation is completed, the program pulse information generating unit 131 may generate program pulse information based on the number of program pulses applied until the program operation is completed. The program pulse information generating unit 131 may include all circuits, systems, firmware and devices necessary for their respective operations and functions.

The program pulse information may be information indicating whether the number of program pulses applied during a corresponding program operation has exceeded a reference value. In an embodiment, the reference value may be a value less than the maximum program pulse count. The program pulse information generating unit 131 may determine whether the number of program pulses applied during a program operation has exceeded the reference value, and generate program pulse information based on a result of the determination. The program pulse information generating unit 131 may store the generated program pulse information to a status register (not shown) included in the memory device 100. The status register may store status information, which is information about an operating status of the memory device 100. Hence, the status information may include the program pulse information.

For example, if the program pulse information is set, it may indicate that the number of program pulses applied during the program operation has exceeded the reference value. If the program pulse information is released, it may indicate that the number of program pulses applied during the program operation is equal to or less than the reference value. In an embodiment, the set program pulse information may be indicated as '0', and the released program pulse information may be indicated as '1'. Alternatively, the set program pulse information may be indicated as '1', and the released program pulse information may be indicated as '0'.

In response to a status read command received from the memory controller 200, the memory device 100 may provide, to the memory controller 200, the status information stored in the status register.

In various embodiments, the memory device 100 may further include a program pulse information storage unit (not shown) for separately storing the program pulse information. The program pulse information storage unit may be a register or an SRAM. If a program operation is completed, the program pulse information generating unit 131 may generate program pulse information, and store the generated program pulse information to the program pulse information storage unit included in the memory device 100.

The memory device 100 may provide the program pulse information of the program pulse information storage unit to the memory controller 200 in response to a get parameter command input from the memory controller 200.

After the memory device 100 has been manufactured, a test process is performed in order to check a manufactured status, the performance, the reliability, etc. of a memory element of the memory device 100. Although the memory device 100 has passed the test process, a defect or a failure may occur in the memory device 100 as the memory device 100 is repeatedly used. A defect or a failure that occurs as the memory device 100 is repeatedly used is referred to as "growing defect" or "growing failure". A memory block in which a growing defect has occurred is referred to as a "growing bad block (GBB)".

In memory cells included in the memory device 100, a growing defect may occur due to deterioration resulting from the repeated use. If a growing defect occurs, the number of program pulses applied until a corresponding memory cell is programmed may be increased. Therefore, if the number of program pulses applied during the program operation is compared with the reference value that is less than the maximum program pulse count, the probability of occurrence of a growing defect may be pre-detected before the growing defect occurs.

The memory controller 200 may control the operation of the memory device 100 in response to a request of a host 300 or regardless of the request of the host 300.

For example, the memory controller 200 may control the memory device 100 to perform a program operation, a read operation, or an erase operation in response to a request from the host 300. During the program operation, the memory controller 200 may provide a program command, a physical address, and data to the memory device 100. During the read operation, the memory controller 200 may provide a read command and a physical address to the memory device 100. During the erase operation, the memory controller 200 may provide an erase command and a physical address to the memory device 100.

In an embodiment, the memory controller 200 may autonomously generate a program command, an address and data without a request from the host 300, and transmit them to the memory device 100. For example, the memory controller 200 may provide a command, an address and data to the memory device 100 in order to perform a program operation for wear leveling, or a program operation for garbage collection.

The memory controller 200 may execute firmware (FW) for controlling the memory device 100. In the case where the memory device 100 is a flash memory device, the memory controller 200 may manage firmware such as a flash translation layer (FTL) for controlling communication between the host 300 and the memory device 100. In detail, the memory controller 200 may translate a logical address included in a request from the host 300 into a physical address.

The memory controller 200 may include a buffer memory (not shown). In an embodiment, the memory controller 200 may control data exchange between the host 300 and the buffer memory. Alternatively, the memory controller 200 may temporarily store system data for controlling the memory device 100 to the buffer memory. For example, the memory controller 200 may temporarily store, to the buffer memory, data input from the host 300, and thereafter transmit the data temporarily stored in the buffer memory to the memory device 100.

In various embodiments, the buffer memory may be used as an operating memory or a cache memory of the memory controller 200. The buffer memory may store codes or commands to be executed by the memory controller 200. Also, the buffer memory may store data to be processed by the memory controller 200. Furthermore, the buffer memory may store a logical-physical address mapping table indicating a mapping relationship between logical addresses and physical addresses. In an embodiment, the buffer memory device may be embodied using an SRAM or a DRAM such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or a rambus dynamic random access memory (RDRAM).

In an embodiment, the memory controller 200 may control at least two memory devices 100. In this case, the memory controller 200 may control the memory devices 100 in an interleaving manner in order to enhance the operating performance.

The memory controller 200 may further include a growing defect processing unit 210. The growing defect processing unit 210 may process memory cells in which growing defects have occurred or the probability of occurrence of a growing defect is present, among the memory cells included in the memory device 100. For example, the growing defect processing unit 210 may invalidate data stored in the memory cells in which growing defects have detected so that the corresponding memory cells are no longer used. The growing defect processing unit 210 may set a memory block including memory cells in which the probability of occurrence of a growing defect is present, as a read-only block allowing only a read operation to be performed thereon.

The growing defect processing unit 210 may determine whether the probability of a growing defect occurring in memory cells is present, based on the program pulse information input from the memory device 100. For example, the growing defect processing unit 210 may read a page in which the number of program pulses applied during a program operation has exceeded the reference value, and may set, if the read operation has passed, a memory block including the page in which the number of program pulses applied during the program operation has exceeded the reference value, as a growing bad block candidate. The growing defect processing unit 210 may set the memory block set as the growing bad block candidate, as a read-only block allowing only a read operation to be performed thereon, and may no longer perform a program operation on the read-only block. If the read operation has failed, the growing defect processing unit 210 may invalidate data stored in the corresponding page, and may re-perform the program operation on another memory region included in the memory device 100.

The host 300 may communicate with the storage device 50 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

Figure 2:
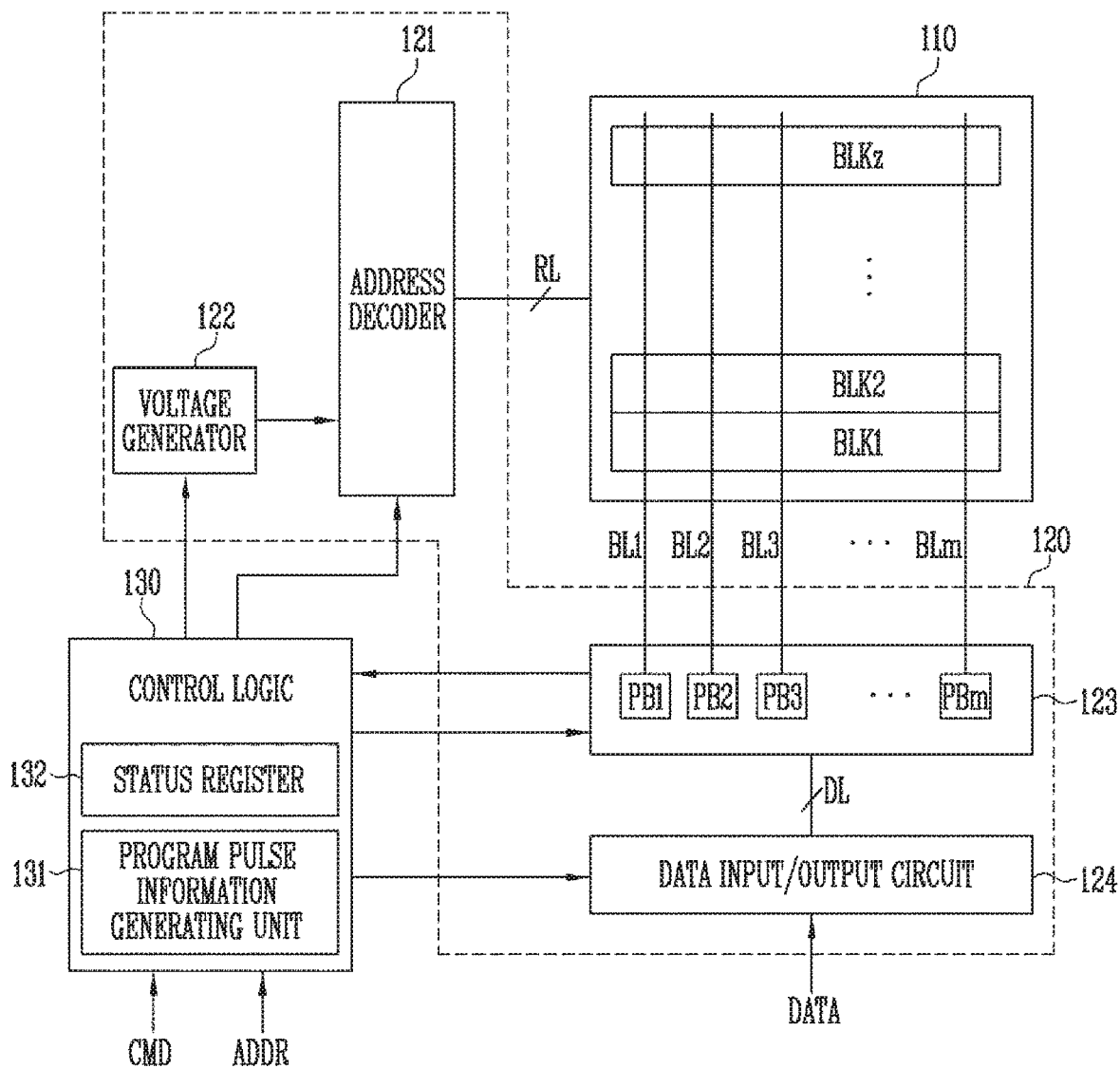
FIG. 2 is a diagram illustrating the configuration of a memory device shown in FIG. 1.

FIG. 2 is a diagram illustrating the structure of the memory device 100.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz are coupled to an address decoder 121 through row lines RL. The memory blocks BLK1 to BLKz are coupled to a read/write circuit 123 through bit lines BL1 to BLm. Each of the memory blocks BLK1 to BLKz may include a plurality of memory cells. In an embodiment, the plurality of memory cells may be nonvolatile memory cells. Memory cells coupled to the same word line among the plurality of memory cells are defined as one page. In other words, the memory cell array 110 is formed of a plurality of pages. In an embodiment, each of the memory blocks BLK1 to BLKz included in the memory cell array 110 may include a plurality of dummy cells. Here, one or more dummy cells may be coupled in series between a drain select transistor and the memory cells, and between a source select transistor and the memory cells.

Each of the memory cells of the memory device 100 may be formed of a single level cell (SLC) capable of storing a single data bit, a multi-level cell (MLC) capable of storing two data bits, a triple-level cell (TLC) capable of storing three data bits, or a quad-level cell (QLC) capable of storing four data bits.

The peripheral circuit 120 may include an address decoder 121, a voltage generator 122, a read/write circuit 123, and a data input/output circuit 124.

The peripheral circuit 120 may drive the memory cell array 110. For example, the peripheral circuit 120 may drive the memory cell array 110 to perform a program operation, a read operation, or an erase operation.

The address decoder 121 is coupled to the memory cell array 110 through the row lines RL. The row lines RL may include drain select lines, word lines, source select lines, and a common source line. In an embodiment, the word lines may include normal word lines and dummy word lines. In an embodiment, the row lines RL may further include a pipe select line.

The address decoder 121 may operate under control of the control logic 130. The address decoder 121 may receive addresses ADDR from the control logic 130.

The address decoder 121 may decode a block address among the received addresses ADDR. The address decoder 121 may select at least one of the memory blocks BLK1 to BLKz according to the decoded block address. The address decoder 121 may decode a row address among the received addresses ADDR. The address decoder 121 may select at least one word line WL of the selected memory block by applying voltages supplied from the voltage generator 122 to at least one word line WL according to the decoded row address.

During a program operation, the address decoder 121 may apply a program voltage to a selected word line and apply a pass voltage having a level lower than that of the program voltage to unselected word lines. During a program verify operation, the address decoder 121 may apply a verify voltage to a selected word line and apply a verify pass voltage higher than the verify voltage to unselected word lines.

During a read operation, the address decoder 121 may apply a read voltage to a selected word line and apply a pass voltage higher than the read voltage to unselected word lines.

In an embodiment, an erase operation of the memory device 100 may be performed on a memory block basis. During the erase operation, an address ADDR to be inputted to the memory device 100 includes a block address. The address decoder 121 may decode the block address and select a corresponding one memory block according to the decoded block address. During the erase operation, the address decoder 121 may apply a ground voltage to word lines coupled to the selected memory block.

In an embodiment, the address decoder 121 may decode a column address among the transmitted addresses ADDR. A decoded column address DCA may be transmitted to the read/write circuit 123. In an embodiment, the address decoder 121 may include components such as a row decoder, a column decoder, and an address buffer.

The voltage generator 122 may generate a plurality of voltages using an external supply voltage supplied to the memory device 100. The voltage generator 122 may operate under control of the control logic 130.

In an embodiment, the voltage generator 122 may generate an internal supply voltage by regulating the external supply voltage. The internal supply voltage generated from the voltage generator 122 may be used as an operating voltage of the memory device 100.

In an embodiment, the voltage generator 122 may generate a plurality of voltages using the external supply voltage or the internal supply voltage. The voltage generator 122 may generate various voltages required in the memory device 100. For example, the voltage generator 122 may generate a plurality of program voltages, a plurality of pass voltages, a plurality of select read voltages, and a plurality of unselect read voltages.

For example, the voltage generator 122 may include a plurality of pumping capacitors for receiving the internal supply voltage, and generate a plurality of voltages by selectively activating the plurality of pumping capacitors under control of the control logic 130.

The generated voltages may be supplied to the memory cell array 110 by the address decoder 121.

The read/write circuit 123 may include first to m-th page buffers PB1 to PBm. The first to m-th page buffers PB1 to PBm are coupled to the memory cell array 110 through the first to m-th bit lines BL1 to BLm, respectively. The first to m-th page buffers PB1 to PBm may operate under control of the control logic 130.

The first to m-th page buffers PB1 to PBm may perform data communication with the data input/output circuit 124. During a program operation, the first to m-th page buffers PB1 to PBm may receive data DATA to be stored through the data input/output circuit 124 and data lines DL.

During a program operation, the first to m-th page buffers PB1 to PBm may transmit the data DATA, received through the data input/output circuit 124, to selected memory cells through the bit lines BL1 to BLm when a program pulse is applied to a selected word line. The memory cells in the selected page are programmed based on the transmitted data DATA. Memory cells coupled to a bit line to which a program allowable voltage (e.g. a ground voltage) is applied may have increased threshold voltages. Threshold voltages of memory cells coupled to a bit line to which a program inhibit voltage (for example, a supply voltage) Is applied may be retained. During a program verify operation, the first to m-th page buffers PB1 to PBm may read page data from selected memory cells through the bit lines BL1 to BLm.

During a read operation, the read/write circuit 123 may read data DATA from the memory cells in the selected page through the bit lines BL, and output the read data DATA to the data input/output circuit 124.

During an erase operation, the read/write circuit 123 may float the bit lines BL. In an embodiment, the read/write circuit 123 may include a column select circuit.

The data input/output circuit 124 is coupled to the first to m-th page buffers PB1 to PBm through the data lines DL. The data Input/output circuit 124 may operate under control of the control logic 130.

The data input/output circuit 124 may include a plurality of input/output buffers (not shown) for receiving inputted data. During a program operation, the data input/output circuit 124 may receive data DATA to be stored from an external controller (not shown). During a read operation, the data input/output circuit 124 may output, to the external controller, the data received from the first to m-th page buffers PB1 to PBm included in the read/write circuit 123.

The control logic 130 may be coupled to the address decoder 121, the voltage generator 122, the read/write circuit 123, and the data input/output circuit 124. The control logic 130 may control the overall operation of the memory device 100. The control logic 130 may operate in response to a command CMD transmitted from an external device.

In an embodiment, the control logic 130 may further include a program pulse information generating unit 131 and a status register 132. The program pulse information generating unit 131 may have the same structure as that of the program pulse information generating unit 131 described with reference to FIG. 1. The structures and operation of the program pulse information generating unit 131 and the status register 132 will be described in detail later herein with reference to FIGS. 8 to 10.

Figure 3:
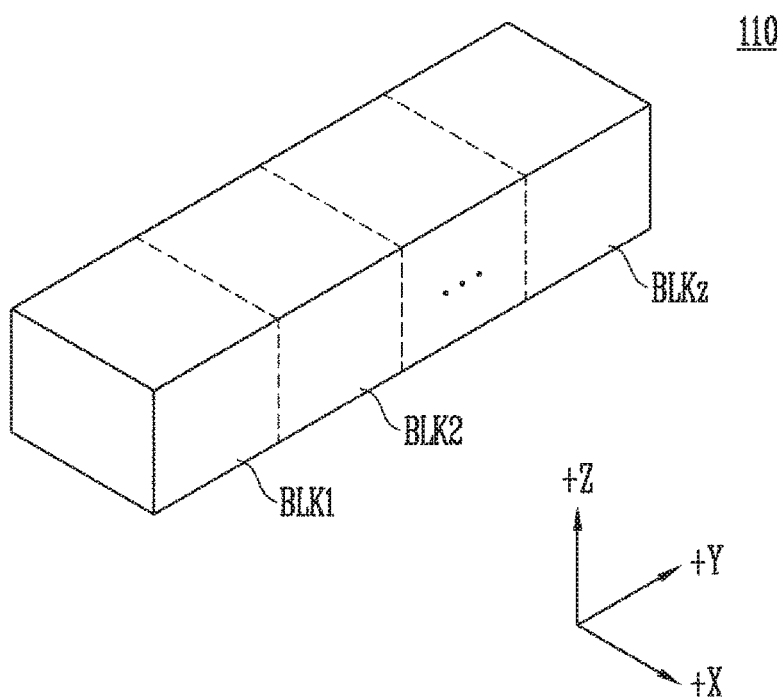
FIG. 3 is a diagram illustrating an embodiment of a memory cell array of FIG. 2.

FIG. 3 is a diagram illustrating an embodiment of the memory cell array 110 of FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 4 and 5.

Figure 4:
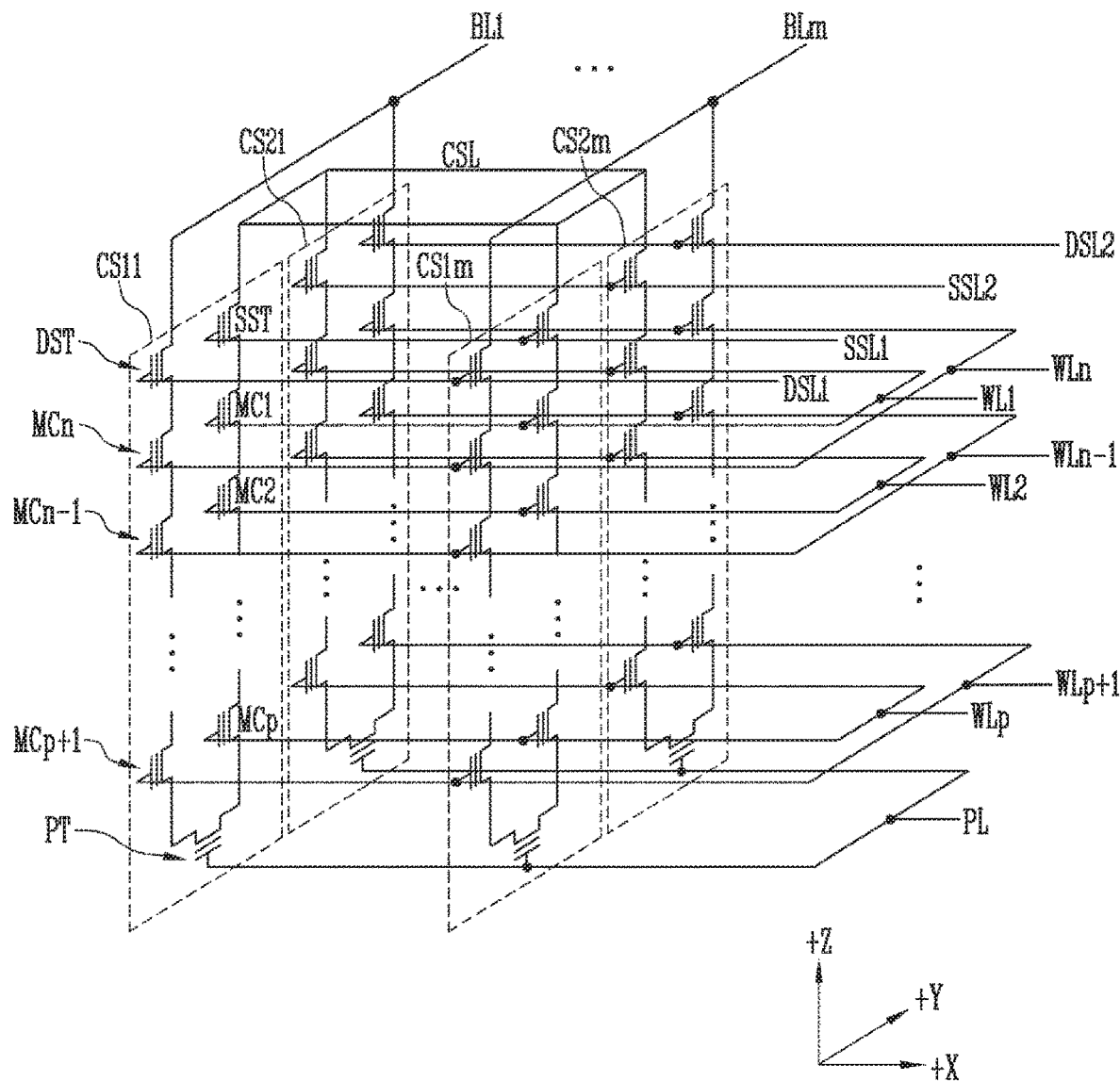
FIG. 4 is a circuit diagram illustrating any one of memory blocks shown in FIG. 3, in accordance with an embodiment of the present disclosure.

FIG. 4 is a circuit diagram illustrating any one BLKa of the memory blocks BLK1 to BLKz of FIG. 3, in accordance with an embodiment of the present disclosure.

Referring to FIG. 4, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 4, two cell strings are illustrated as being arranged in a column direction (i.e., the +Y direction). However, this illustration is made only for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 4, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+i-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 4, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from the selected cell strings.

In an embodiment, even bit lines and odd bit lines may be provided in lieu of the first to m-th bit lines BL1 to BLm. Even-number-th cell strings of the cell strings CS11 to CS1m or CS21 to CS2m arranged in the row direction may be coupled to respective even bit lines. Odd-number-th cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCp. Alternatively, at least one or more dummy memory cells may be provided to reduce an electric field between the drain select transistor DST and the memory cells MCp+1 to MCn.

As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the at least one dummy memory cells, each of the dummy memory cells may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 5:
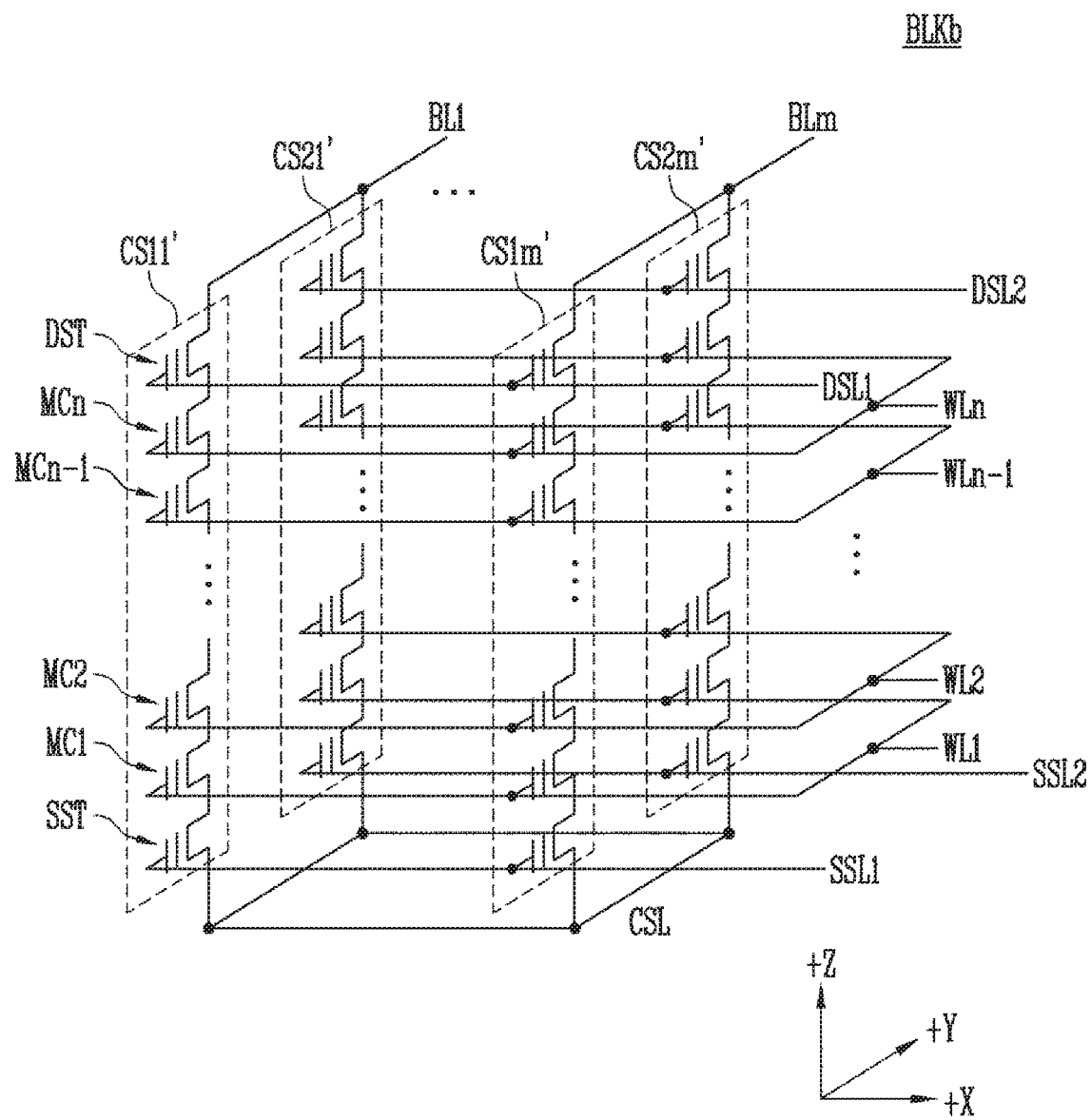
FIG. 5 is a circuit diagram illustrating any one of the memory blocks shown in FIG. 3, in accordance with an embodiment of the present disclosure.

FIG. 5 is a circuit diagram illustrating any one BLKb of the memory blocks BLK1 to BLKz of FIG. 3, in accordance with an embodiment of the present disclosure.

Referring to FIG. 5, the memory block BLKb may include a plurality of cell strings CS11' to CS1m' and CS21' to CS2m'. Each of the cell strings CS11' to CS1m' and CS21' to CS2m' extends in the +Z direction. Each of the cell strings CS11' to CS1m' and CS21' to CS2m' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1m' arranged in a first row may be coupled to a first source select line SSL1. Source select transistors of the cell strings CS21' to CS2m' arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1m' in the first row are coupled to a first drain select line DSL1. Drain select transistors of the cell strings CS21' to CS2m' in the second row may be coupled to a second drain select line DSL2.

Consequentially, the memory block BLKb of FIG. 5 may have an equivalent circuit similar to that of the memory block BLKa of FIG. 4 except that a pipe transistor PT Is excluded from each cell string.

In an embodiment, even bit lines and odd bit lines may be provided in lieu of the first to m-th bit lines BL1 to BLm. Even-number-th cell strings among the cell strings CS11' to CS1m' or CS21' to CS2m' arranged in the row direction may be coupled to the respective even bit lines, and odd-number-th cell strings among the cell strings CS11' to CS1m' or CS21' to CS2m' arranged in the row direction may be coupled to the respective odd bit lines.

In an embodiment, at least one of the first to n-th memory cells MC1 to MCn may be used as a dummy memory cell. For example, at least one or more dummy memory cells may be provided to reduce an electric field between the source select transistor SST and the memory cells MC1 to MCn. Alternatively, at least one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the at least one dummy memory cells, each of the dummy memory cells may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
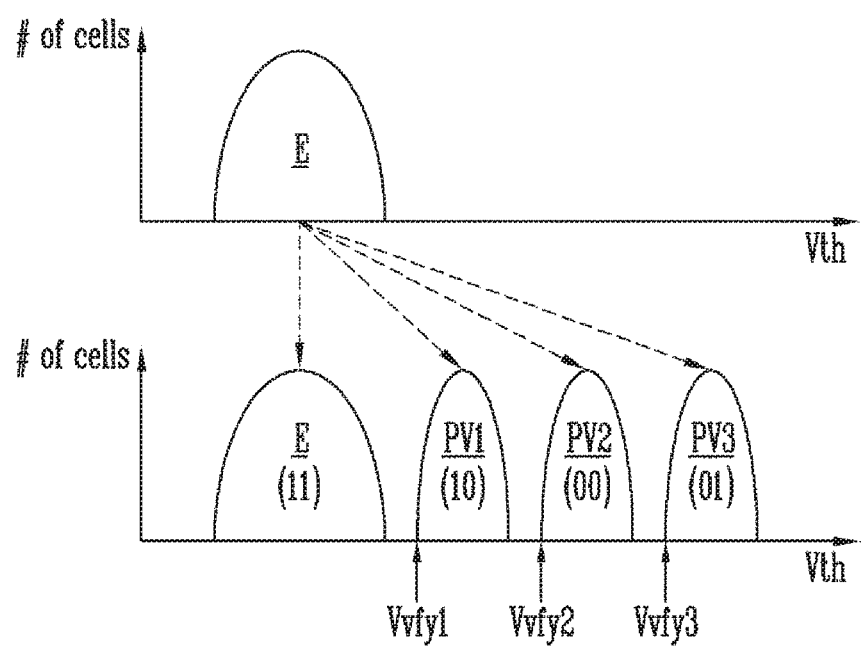
FIG. 6 is a diagram illustrating threshold voltage distributions of memory cells that are formed by a program operation, in accordance with an embodiment of the present disclosure.

FIG. 6 is a diagram illustrating threshold voltage distributions of memory cells that are formed by a program operation, in accordance with an embodiment of the present disclosure.

Figure 7:
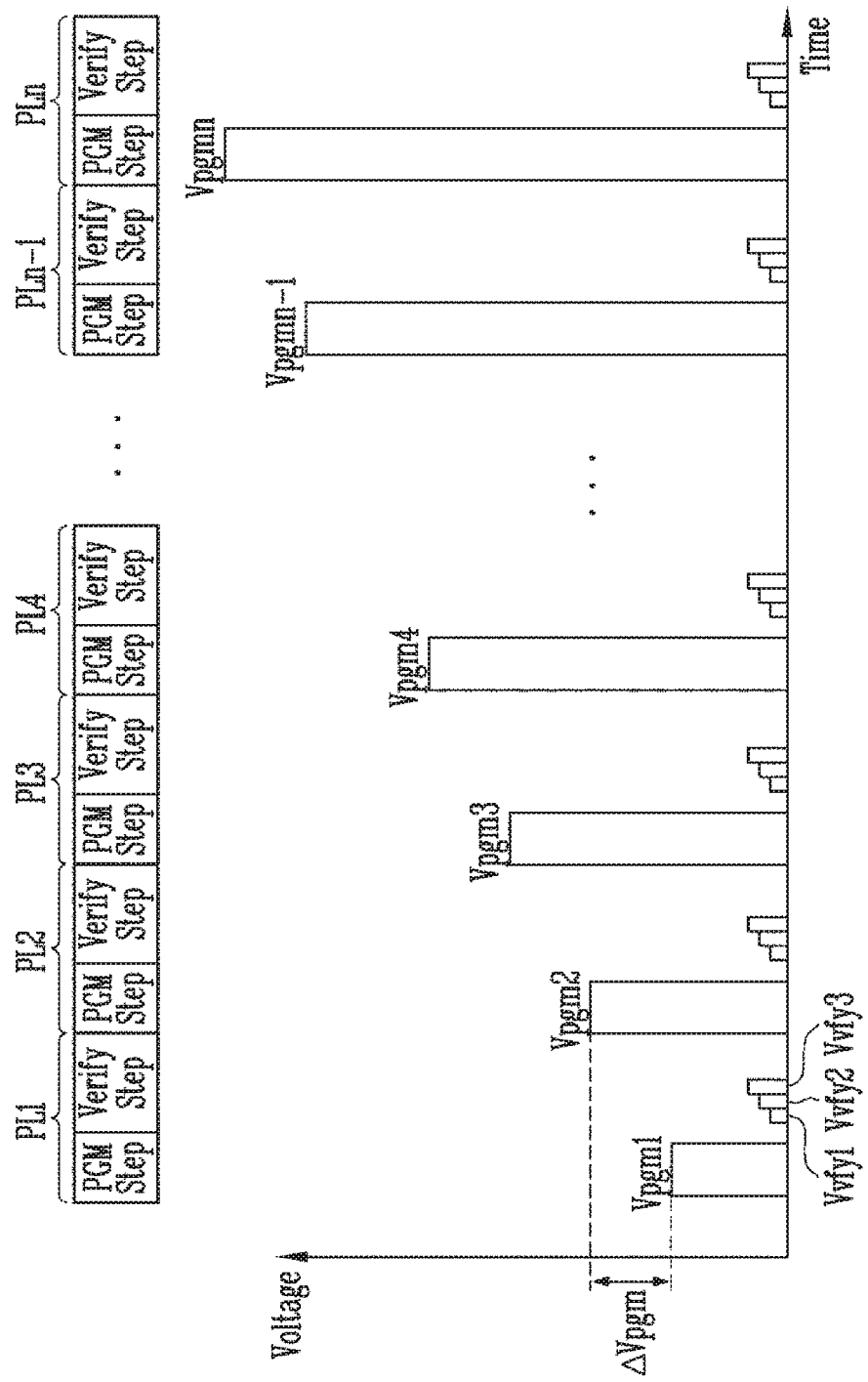
FIG. 7 is a diagram illustrating a program operation for the memory device in accordance with an embodiment of the present disclosure.

FIG. 7 is a diagram illustrating a program operation of the memory device in accordance with an embodiment of the present disclosure.

Hereinafter, it is assumed that each of the plurality of memory cells is a multi-level cell (MLC) capable of storing 2-bit data. However, the scope of the present disclosure is not limited to the foregoing case. For example, each of the plurality of memory cells may be a triple level cell (TLC) capable of storing 3-bit data, or a quad level cell (QLC) capable of storing a 4-bit data.

Referring to FIGS. 6 and 7, an erase status E may correspond to data '11', a first program status P1 may correspond to data '10', a second program status P2 may correspond to data '00', and a third program status P3 may correspond to data '01'. However, the foregoing bit ordering is only exemplary and may be modified in various ways.

A program operation of the memory device 100 may include a plurality of program loops PL1 to PLn. In other words, the memory device 100 may perform a plurality of program loops PL1 to PLn to program selected memory cells so that each of the selected memory cells has any one of a plurality of programmed statuses P1, P2, and P3.

Each of the plurality of program loops PL1 to PLn may include a program voltage application step PGM Step of applying a program pulse, and a verify step Verify Step of applying verify voltages to determine whether memory cells have been programmed.

For example, when a first program loop PL1 is performed, a first program pulse Vpgm1 is applied and, thereafter, first to third verify voltages Vvfy1 to Vvfy3 are sequentially applied to verify programmed to statuses of the memory cells. Here, the first verify voltage Vvfy1 may be used to perform a verify operation on memory cells of which the target programmed status is the first programmed status P1. The second verify voltage Vvfy2 may be used to perform a verify operation on memory cells of which the target programmed status is the second programmed status P2. The third verify voltage Vvfy3 may be used to perform a verify operation on memory cells of which the target programmed status is the third programmed status P3.

Memory cells (verify-passed memory cells) that have passed the verify operation by the corresponding verify voltages Vvfy1 to Vvfy3 are determined to have the corresponding target programmed status, and thereafter may be program-inhibited in the second program loop PL2. In the second program loop PL2, a second program pulse Vpgm2 higher than the first program pulse Vpgm1 by a unit voltage ΔVpgm is applied in order to program memory cells other than the program-inhibited memory cells. Subsequently, a verify operation is performed in the same manner as the verify operation of the first program loop PL1. For example, "verify pass" indicates that a memory cell is determined to be an off-cell by a corresponding verify voltage.

As described above, when the memory device 100 programs multi-level cells (MLCs) each of which is capable of storing 2-bit data, the memory device 100 verifies, using the first to third verify voltages Vvfy1 to Vvfy3, the memory cells of which the target programmed statuses are corresponding programmed statuses.

At the verify step, a verify voltage may be applied to a selected word line, which is a word line coupled with the selected memory cells. The page buffers may determine whether the memory cells have passed the verification, based on voltages or currents flowing through bit lines coupled with the respective selected memory cells.

Figure 8:
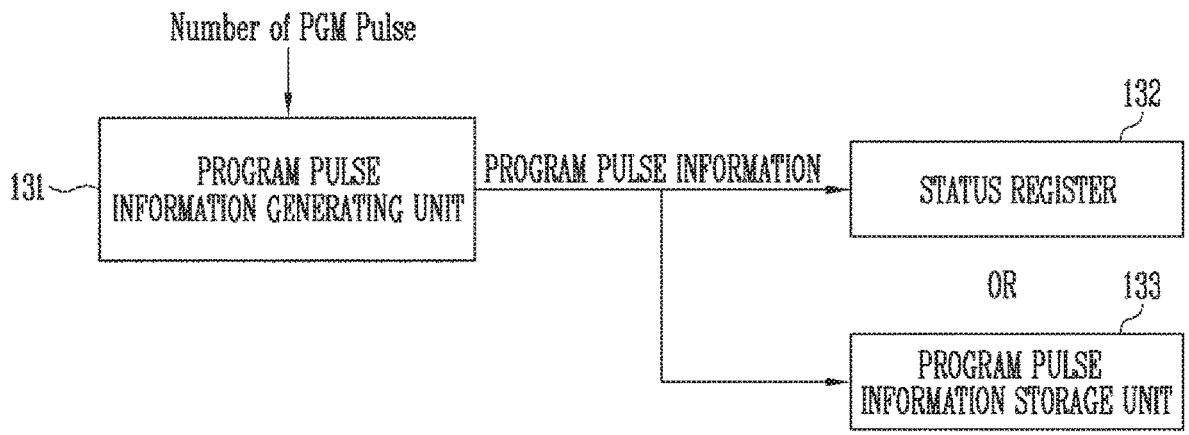
FIG. 8 is a diagram illustrating an operation of a program pulse information generating unit shown in FIG. 2.

FIG. 8 is a diagram illustrating the operation of the program pulse information generating unit 131 of FIG. 2.

Referring to FIG. 8, when a program operation is completed, the program pulse information generating unit 131 may receive the number of program pulses applied during the corresponding program operation.

The program pulse information generating unit 131 may determine whether the number of program pulses applied during the program operation has exceeded a preset reference value. The program pulse information generating unit 131 may store program pulse information based on a result of the determination. For example, if the number of program pulses applied during the program operation has exceeded the preset reference value, the program pulse information generating unit 131 may generate set program pulse information. If the number of program pulses applied during the program operation is equal to or less than the preset reference value, the program pulse information generating unit 131 may generate released program pulse information. In an embodiment, the set program pulse information may be indicated as '0', and the released program pulse information may be indicated as '1'. Alternatively, the set program pulse information may be indicated as '1', and the released program pulse information may be indicated as '0'.

The program pulse information generating unit 131 may store the generated program pulse information to the status register 132 or the program pulse information storage unit 133.

Figure 9:
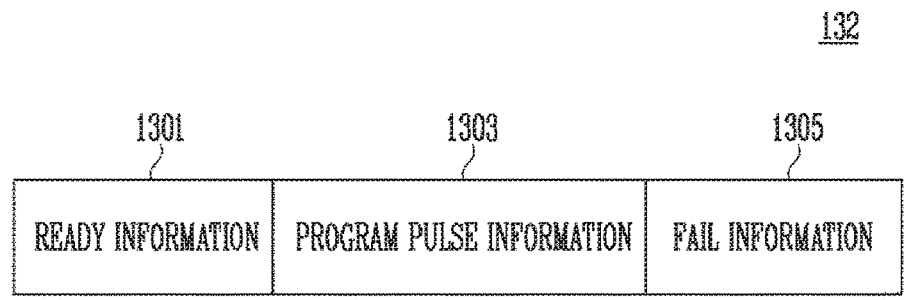
FIG. 9 is a diagram illustrating a status register shown in FIG. 8.

FIG. 9 is a diagram illustrating the status register 132 of FIG. 8.

The status register 132 may store status information indicating the operating status of the memory device. Values of data stored in the status register 132 may vary depending on the operation of the memory device.

Referring to FIG. 9, data stored in the status register 132 may include ready information 1301, program pulse information 1303, and fail information 1305.

The ready information 1301 may indicate that the memory device is ready for performing a new command. In an embodiment, the ready information 1301 may indicate that reception of a new command is possible, and an operation for a previously received command has been completed. The memory controller 200 may determine whether the operation corresponding to the command that has been previously provided has been completed, using the ready information 1301.

The program pulse information 1303 may be information indicating whether the number of program pulses applied during a program operation performed by the memory device 100 has exceeded the reference value. For example, if the program pulse information is set, it may indicate that the number of program pulses applied during the program operation has exceeded the reference value. If the program pulse information is released, it may indicate that the number of program pulses applied during the program operation is equal to or less than the reference value. In an embodiment, the set program pulse information may be indicated as '0', and the released program pulse information may be indicated as '1'. Alternatively, the set program pulse information may be indicated as '1', and the released program pulse information may be indicated as '0'.

The fail information 1305 may indicate that an operation corresponding to a latest command has failed. In an embodiment, the fail information 1305 may have a valid value only for a program operation or an erase operation. In various embodiments, the fail information 1305 may indicate that an operation corresponding to a command received prior to the latest command has failed. During the program operation, if target memory cells have not passed the program verification step despite the maximum program pulse count of the applied program pulses, the memory device 100 may determine that the program operation has failed. In this case, the memory device 100 may store the fail information 1305 indicating that the program operation has failed, to the status register.

Figure 10:
FIG. 10 is a diagram illustrating a program pulse information storage unit shown in FIG. 8.

FIG. 10 is a diagram illustrating the program pulse information storage unit 133 of FIG. 8.

Referring to FIG. 10, the program pulse information storage unit 133 may include a page address PAGE ADDRESS and program pulse information PGM PULSE INFO. The program pulse information storage unit 133 may be a register or an SRAM.

The program pulse information PGM PULSE INFO may be information indicating whether the number of program pulses applied during a program operation performed by the memory device has exceeded the reference value. For example, if the program pulse information PGM PULSE INFO is set, it may indicate that the number of program pulses applied during the program operation has exceeded the reference value. If the program pulse information PGM PULSE INFO is released, it may indicate that the number of program pulses applied during the program operation is equal to or less than the reference value. In an embodiment, the set program pulse information PGM PULSE INFO may be indicated as '0', and the released program pulse information PGM PULSE INFO may be indicated as '1'. Alternatively, the set program pulse information PGM PULSE INFO may be indicated as '1', and the released program pulse information PGM PULSE INFO may be indicated as '0'.

Figure 11:
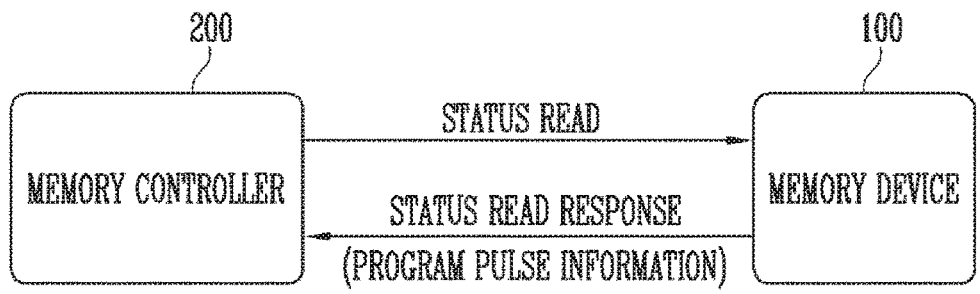
FIG. 11 is a diagram illustrating data communication between a memory controller and the memory device in accordance with an embodiment of the present disclosure.

FIG. 11 is a diagram illustrating data communication between the memory controller 200 and the memory device 100 in accordance with an embodiment of the present disclosure.

Referring to FIG. 11, if a preset time has passed after the memory controller 200 has provided a program command to the memory device 100, the memory controller 200 may provide a status read command STATUS READ to the memory device 100.

The status read command STATUS READ may be a command for requesting the value of the status register that stores status information that indicates the operating status of the memory device 100. In detail, the memory device 100 may update the status register (not shown) included in the memory device 100, depending on the operating status of the memory device 100.

When the status read command STATUS READ is received, the memory device 100 may provide, in response to the status read command STATUS READ, a value stored in the status register to the memory controller 200 as a status read response.

In accordance with an embodiment of the present disclosure, the memory device 100 may store, to the status register, program pulse information indicating whether the number of program pulses applied during a program operation performed by the memory device 100 has exceeded the reference value. For example, if the number of program pulses applied during the program operation has exceeded the reference value, the memory device 100 may store the set program pulse information to the status register. If the number of program pulses applied during the program operation is equal to or less than the reference value, the memory device 100 may store the released program pulse information to the status register. The memory device 100 may provide, in response to the status read command STATUS READ, a status register value including the program pulse information to the memory controller 200 as a status read response.

Figure 12:
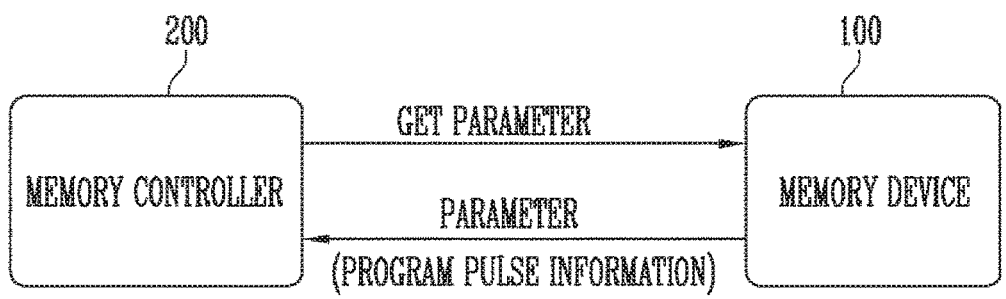
FIG. 12 is a diagram illustrating data communication between the memory controller and the memory device in accordance with an embodiment of the present disclosure.

FIG. 12 is a diagram illustrating data communication between the memory controller 200 and the memory device 100 in accordance with an embodiment of the present disclosure.

Referring to FIG. 12, the memory device 100 may generate program pulse information PGM PULSE INFO indicating whether the number of program pulses applied during a program operation performed by the memory device 100 exceeds the reference value. The memory device 100 may store the generated program pulse information PGM PULSE INFO to the program pulse information storage unit. The program pulse information storage unit may be a register or an SRAM.

Therefore, the memory controller 200 may obtain the program pulse information PGM PULSE INFO by providing a get parameter command GET PARAMETER to the memory device 100. In detail, the get parameter command GET PARAMETER may be a command for requesting data stored in the register corresponding to a parameter address among a plurality of registers included in the memory device 100. The memory controller 200 may provide the get parameter command GET PARAMETER and the parameter address corresponding to the program pulse information storage unit to the memory device 100. The memory device 100 may provide the program pulse information PGM PULSE INFO stored in the program pulse information storage unit to the memory controller 200, in response to the get parameter command GET PARAMETER input from the memory controller 200.

Figure 13:
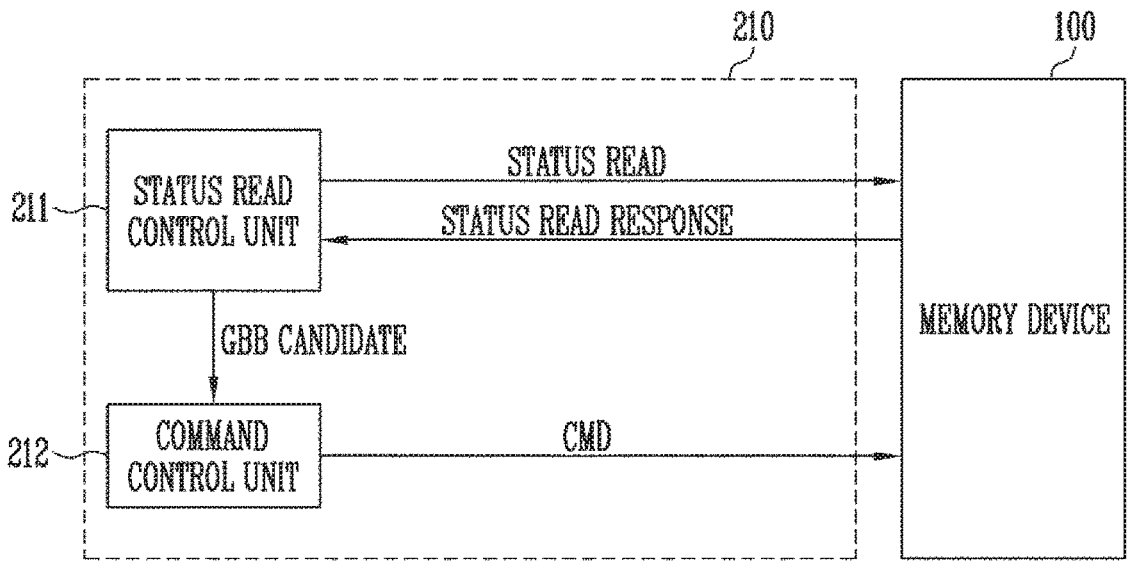
FIG. 13 is a diagram illustrating an operation of a growing defect processing unit shown in FIG. 1.

FIG. 13 is a diagram illustrating the operation of the growing to defect processing unit 210 of FIG. 1.

Referring to FIG. 13, the growing defect processing unit 210 may include a status read control unit 211 and a command control unit 212.

When a preset time has passed after the status read control unit 211 has provided a program command to the memory device 100, the status read control unit 211 may provide a status read command STATUS READ to the memory device 100. In an embodiment, the preset time may be an expected time tPROG required for performing a program operation.

The status read command STATUS READ may be a command for requesting a value of the status register that stores status information that indicates the operating status of the memory device 100. In detail, the memory device 100 may update the status register (not shown) included in the memory device 100, depending on the operating status of the memory device 100. When the status read command STATUS READ is received, the memory device 100 may provide, in response to the status read command STATUS READ, a value stored in the status register to the memory controller 200 as a status read response. The status read control unit 211 may receive the status read response that is provided from the memory device 100 in response to the status read command STATUS READ.

Based on the program pulse information included in the status read response, the status read control unit 211 may determine the probability of a growing defect in a target page of the corresponding program operation. In detail, if the program pulse information is set, the status read control unit 211 may determine a high probability of a growing defect in the target page. On the other hand, if the program pulse information is released, the status read control unit 211 may determine a low probability of a growing defect in the target page.

If the probability of a growing defect occurring in the memory cells is determined as high, the status read control unit 211 may set a memory block including the target page as a growing bad block candidate (GBB CANDIDATE). In an embodiment, the status read control unit 211 may set, as a growing bad block candidate, a memory block including a page in which the number of program pulses applied during a program operation has exceeded the reference value.

The command control unit 212 may provide a read command CMD for reading data stored in the memory cells of the growing bad block candidate. In detail, in order to determine whether data stored by the program operation is normally read, the command control unit 212 may provide to the memory device 100 a read command for reading the programmed data from the growing bad block candidate. If the read operation of reading the programmed data has passed, the data may be determined to be valid data. In this case, the memory controller 200 may set the growing bad block candidate as a read-only memory block. In other words, the memory controller 200 may allow only a read operation to be performed later, on the growing bad block candidate but may not allow a program operation to be performed thereon.

If the read operation has failed, the memory controller 200 may process the data stored in the corresponding page as invalid data. In this case, the command control unit 212 may control the memory device 100 to re-perform the program operation on another memory region with the original version of the data stored in the growing bad block candidate.

Figure 14:
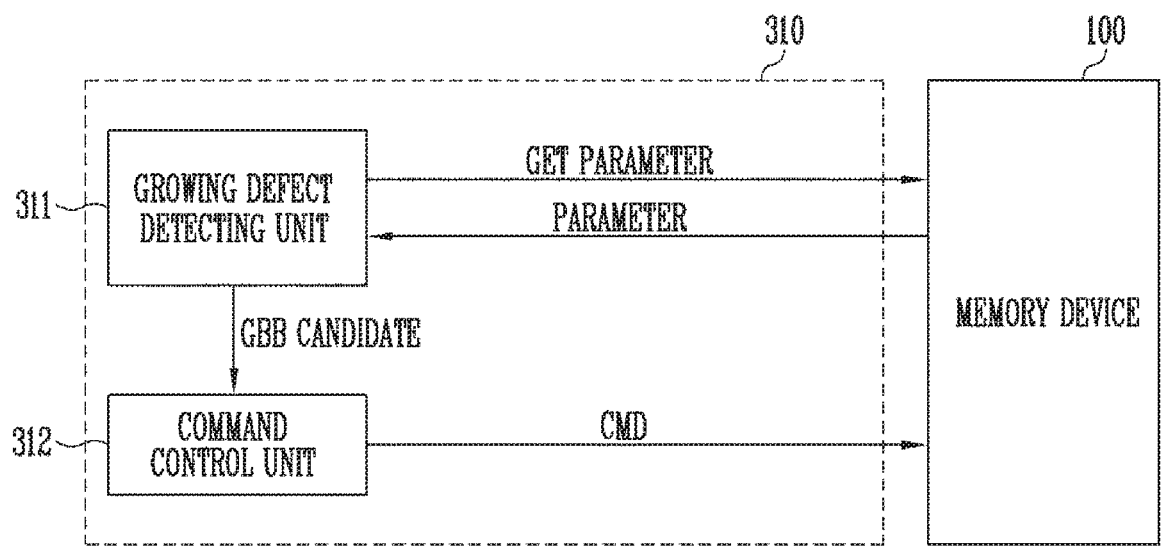
FIG. 14 is a diagram illustrating an embodiment of the growing defect processing unit shown in FIG. 1.

FIG. 14 is a diagram illustrating an embodiment of the growing defect processing unit 210 of FIG. 1. The growing defect processing unit 210 of FIG. 1 may correspond to the growing defect processing unit 310 of FIG. 14.

Referring to FIG. 14, the growing defect processing unit 310 may include a growing defect detecting unit 311 and a command control unit 312.

When, based on a status read response, the memory controller 200 recognizes that a program operation has been completed, the growing defect detecting unit 311 may provide, to the memory device 100, a parameter setting command GET PARAMETER for requesting program pulse information PGM PULSE INFO stored in the program pulse information storage unit.

Thereafter, the growing defect detecting unit 311 may receive the program pulse information PGM PULSE INFO that is provided from the memory device 100 in response to the parameter setting command GET PARAMETER.

Based on the received program pulse information, the growing defect detecting unit 311 may determine the probability of a growing defect in a target page of the corresponding program operation. In detail, if the program pulse information is set, the growing defect detecting unit 311 may determine a high probability of a growing defect in the target page. On the other hand, if the program pulse information is released, the growing defect detecting unit 311 may determine a low probability of a growing defect in the target page.

If the probability of a growing defect occurring in the memory cells is determined as high, the growing defect detecting unit 311 may set a memory block including the target page as a growing bad block candidate (GBB CANDIDATE). In an embodiment, the growing defect detecting unit 311 may set, as a growing bad block candidate, a memory block including a page in which the number of program pulses applied during a program operation has exceeded the reference value.

The command control unit 312 may provide a read command CMD for reading data stored in the memory cells of the growing bad block candidate. In detail, in order to determine whether data stored by the program operation is normally read, the command control unit 312 may provide to the memory device 100 a read command for reading the programmed data from the growing bad block candidate. If the read operation of reading the programmed data has passed, the data may be determined to be valid data. In this case, the memory controller 200 may set the growing bad block candidate as a read-only memory block. In other words, the memory controller 200 may allow only a read operation to be performed later, on the growing bad block candidate but may not allow a program operation to be performed thereon.

If the read operation has failed, the memory controller 200 may process the data stored in the corresponding page as invalid data. In this case, the command control unit 312 may control the memory device 100 to re-perform the program operation on another memory region with the original version of the data stored in the growing bad block candidate.

Figure 15:
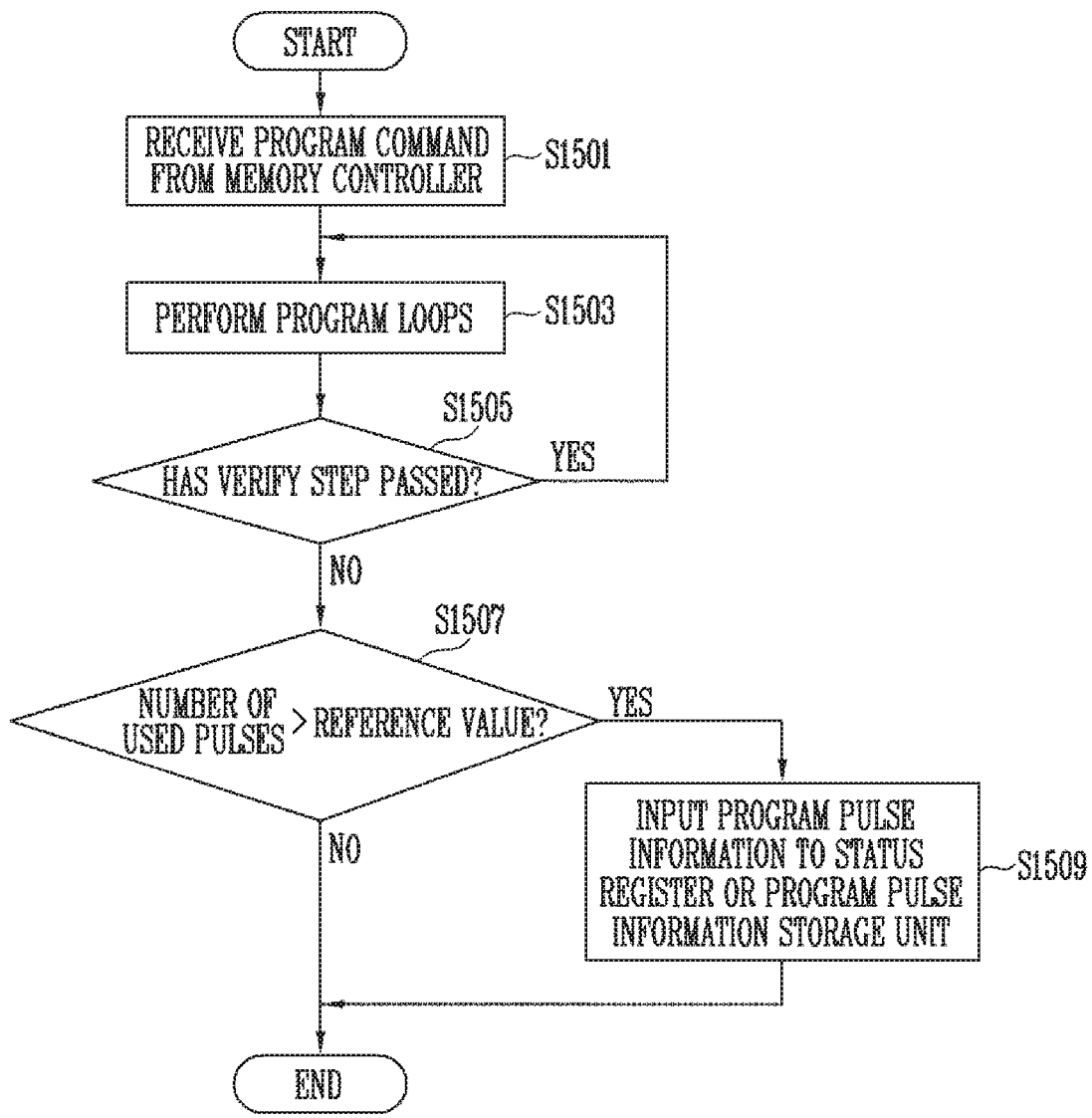
FIG. 15 is a flowchart illustrating an operation of the memory device in accordance with an embodiment of the present disclosure.

FIG. 15 is a flowchart illustrating the operation of the memory device 100 in accordance with an embodiment of the present disclosure.

Referring to FIG. 15, at step S1501, the memory device 100 may receive a command from the memory controller 200. For example, the command may be a program command.

At step S1503 and S1505, the memory device 100 performs a program operation corresponding to the received program command. In detail, the memory device 100 may perform a program loop including a program voltage application step of applying a program pulse and a verify step.

At step S1505, the memory device 100 may determine whether target memory cells have passed the verify step. The memory device 100 may perform step S1503 until the target memory cells pass the verify step. If, at step S1505, the target memory cells have passed to the verify step, the process proceeds to step S1507.

At step S1507, the memory device 100 may determine whether the number of program pulses applied during the program operation has exceeded the reference value. As a result of the determination, if the number of program pulses has exceeded the reference value, the process proceeds to step S1509, and, if not, the program operation is terminated. In various embodiments, if the number of program pulses applied during the program operation is equal to or less than the reference vale, the memory device 100 may store released program pulse information to the status register or the program pulse information storage unit.

At step S1509, the memory device 100 may input set program pulse information to the status register or the program pulse information storage unit.

Figure 16:
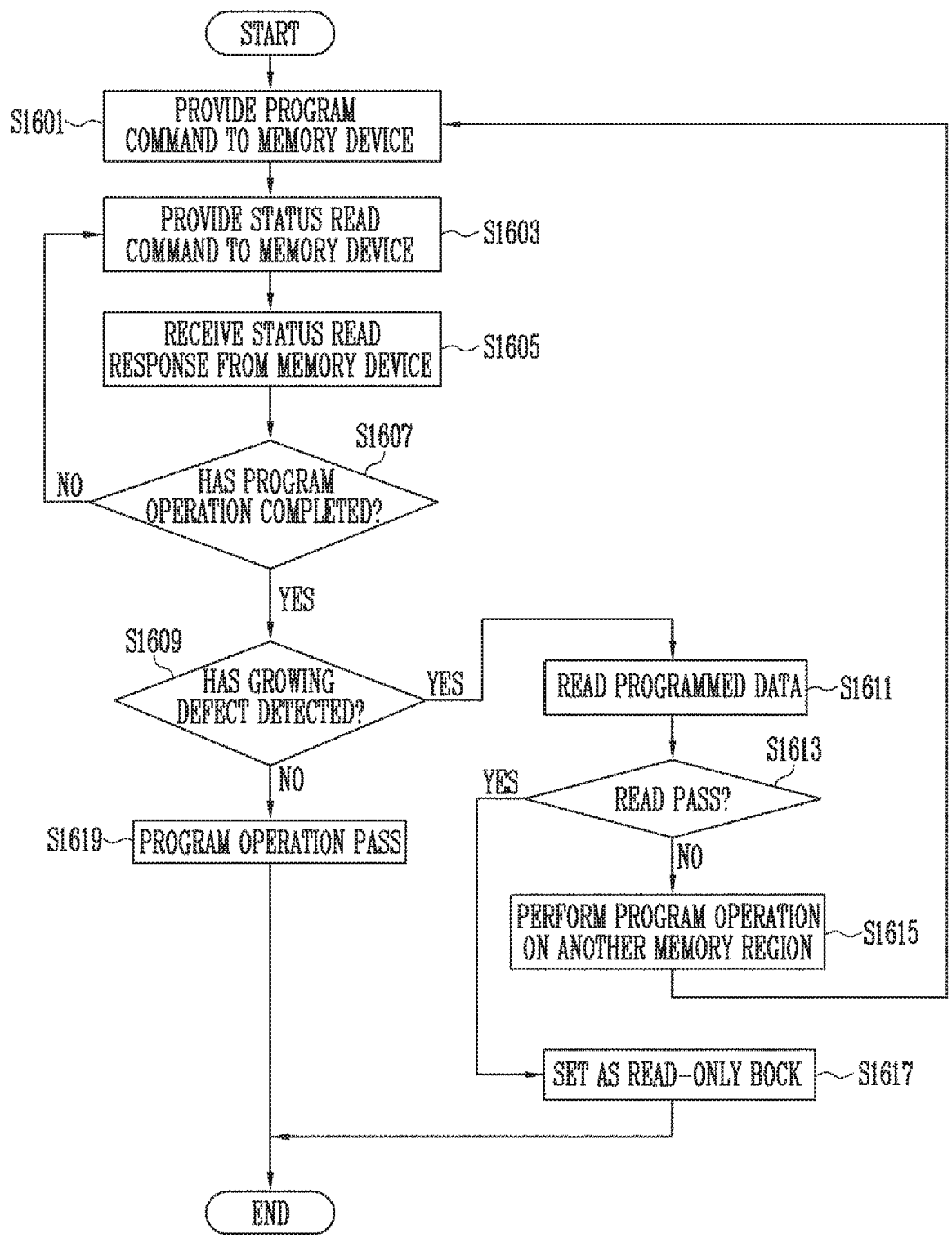
FIG. 16 is a flowchart illustrating an operation of the memory controller in accordance with an embodiment of the present disclosure.

FIG. 16 is a flowchart illustrating the operation of the memory controller 200 in accordance with an embodiment of the present disclosure.

Referring to FIG. 16, at step S1601, the memory controller 200 may provide a program command to the memory device 100. When providing the program command to the memory device 100, the memory controller 200 may provide program data, which is data to be programmed, and a program address indicating a memory region on which the program data is to be programmed, together with the program command.

At step S1603, the memory controller 200 may provide a status read command to the memory device 100. In an embodiment, when a preset time has passed after the program command has been provided at step S1601, the memory controller 200 may provide the status read command to the memory device 100, at step S1603. The status read command may be a command for requesting the value of the status register that stores the status information indicating the operating status of the memory device 100.

At step S1605, the memory controller 200 may receive a status read response provided from the memory device 100. The status read response provided from the memory device 100 may be a value stored in the status register.

At step S1607, the memory controller 200 may determine whether the program operation has been completed, based on the status information included in the status read response provided from the memory device 100. The status information may include ready information, program pulse information, and fail information. The memory controller 200 may determine whether the memory device 100 has completed the program operation, based on the ready information. As a result of the determination, if the program operation has not been completed, the process may return to step S1603. If the program operation has been completed, the process may proceed to step S1609.

At step S1609, the memory controller 200 may detect a probability of a growing defect in a target page of the completed program operation. In detail, the memory controller 200 may determine the probability of a growing defect in the target page of the completed program operation, based on the program pulse information. For example, if the program pulse information is set, the memory controller 200 may determine a high probability of a growing defect in the target page, and may proceed to step S1611. On the other hand, if the program pulse information is released, the memory controller 200 may determine a low probability of a growing defect in the target page, and may proceed to step S1619. At step S1619, the memory controller 200 may determine that the program operation has passed, and may store a result of execution of the program operation or provide the result to an external host.

At step S1611, the memory controller 200 may set, as a growing bad block candidate, a memory block including the page in which the number of program pulses applied during the program operation has exceeded the reference value. The memory controller 200 may provide to the memory device 100 a read command for reading the programmed data from the target page. Thereafter, according to the read command, the memory device 100 may read the data stored in the target page.

At step S1613, the memory controller 200 may determine whether the read operation has passed. In detail, the memory device 100 may provide the read data to the memory controller 200 under control of the memory controller 200. The memory controller 200 may perform an error correction code (ECC) decoding operation on the read data. If the decoding operation has succeeded, it may indicate that the read operation has passed. If the decoding operation has failed, it may indicate that the read operation has failed. If the read operation has passed, the corresponding data may be valid data. However, because of the high probability of a growing defect in the target page, the process proceeds to step S1617. If the read operation has not passed, the process proceeds to step S1615.

At step S1615, the memory controller 200 may re-perform the program operation on another memory region with the original version of the data stored in the target page because the data stored in the target page is invalid data.

At step S1617, the memory controller 200 may set the growing bad block candidate as a read-only memory block allowing only a read operation to be performed thereon, and may no longer perform a program operation on the growing bad block candidate.

Figure 17:
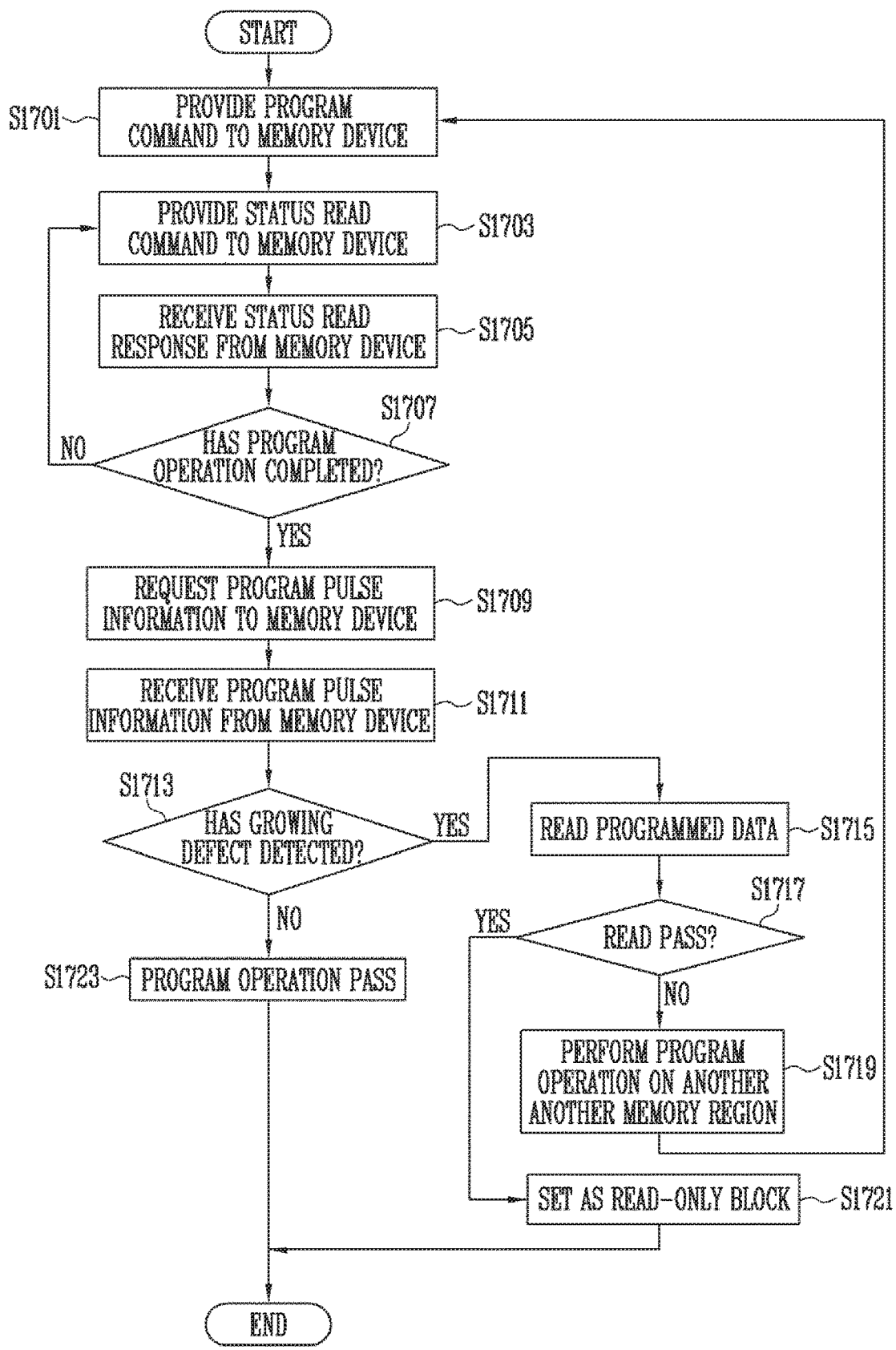
FIG. 17 is a flowchart illustrating an operation of the memory controller in accordance with an embodiment of the present disclosure.

FIG. 17 is a flowchart for illustrating the operation of the memory controller 200 in accordance with an embodiment of the present disclosure.

Referring to FIG. 17, at step S1701, the memory controller 200 may provide a program command to the memory device 100. When providing the program command to the memory device 100, the memory controller 200 may provide program data, which is data to be programmed, and a program address indicating a memory region on which the program data is to be programmed, together with the program command.

At step S1703, the memory controller 200 may provide a status read command to the memory device 100. In an embodiment, when a preset time has passed after the program command has been provided at step S1701, the memory controller 200 may provide the status read command to the memory device 100, at step S1703. The status read command may be a command for requesting the value of the status register that stores the status information indicating the operating status of the memory device 100.

At step S1705, the memory controller 200 may receive a status read response provided from the memory device 100. The status read response provided from the memory device 100 may be a value stored in the status register.

At step S1707, the memory controller 200 may determine whether the program operation has been completed, based on the status information included in the status read response provided from the memory device 100. The status information may include ready information and fail information. The memory controller 200 may determine whether the memory device 100 has completed the program operation, based on the ready information. As a result of the determination, if the program operation has not been completed, the process may return to step S1703. If the program operation has been completed, the process may proceed to step S1709.

At step S1709, the memory controller 200 may request program pulse information PGM PULSE INFO to the memory device 100. In detail, the memory controller 200 may provide a get parameter command GET PARAMETER and a parameter address corresponding to the program pulse information storage unit to the memory device 100.

At step S1711, the memory controller 200 may receive the program pulse information PGM PULSE INFO stored in the program pulse information storage unit and provided from the memory device 100 in response to the get parameter command GET PARAMETER.

At step S1713, the memory controller 200 may detect a probability of a growing defect in a target page of the completed program operation. In detail, the memory controller 200 may determine the probability of a growing defect in the target page of the completed program operation, based on the program pulse information PGM PULSE INFO. For example, if the program pulse information is set, the memory controller 200 may determine a high probability of a growing defect in the target page, and may proceed to step S1715. On the other hand, if the program pulse information is released, the memory controller 200 may determine a low probability of a growing defect in the target page, and may proceed to step S1723. At step S1723, the memory controller 200 may determine that the program operation has passed, and may store a result of execution of the program operation or provide the result to an external host.

At step S1715, the memory controller 200 may set, as a growing bad block candidate, a memory block including the page in which the number of program pulses applied during the program operation has exceeded the reference value. The memory controller 200 may provide to the memory device 100 a read command for reading the programmed data from the target page. Thereafter, according to the read command, the memory device 100 may read the data stored in the target page.

At step S1717, the memory controller 200 may determine whether the read operation has passed. In detail, the memory device 100 may provide the read data to the memory controller 200 under control of the memory controller 200. The memory controller 200 may perform an error correction code (ECC) decoding operation on the read data. If the decoding operation has succeeded, it may indicate that the read operation has passed. If the decoding operation has failed, it may indicate that the read operation has failed. If the read operation has passed, the corresponding data may be valid data. However, because of the high probability of a growing defect in the target page, the process proceeds to step S1721. If the read operation has not passed, the process proceeds to step S1719.

At step S1719, the memory controller 200 may re-perform the program operation on another memory region with the original version of the data stored in the target page because the data stored in the corresponding page is invalid data.

At step S1721, the memory controller 200 may set the growing bad block candidate, as a read-only memory block allowing only a read operation to be performed thereon, and may no longer perform a program operation on the growing bad block candidate.

Figure 18:
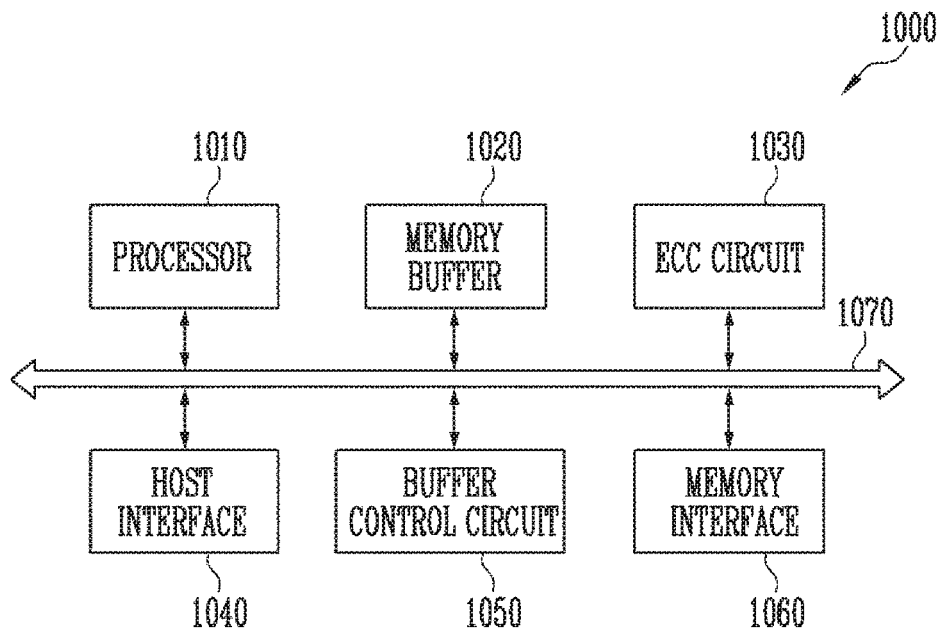
FIG. 18 is a diagram illustrating an embodiment of the memory controller shown in FIG. 1.

FIG. 18 is a diagram illustrating an example of the memory controller of FIG. 1 in accordance with an embodiment of the present disclosure.

Referring to FIG. 18, a memory controller 1000 may include a processor 1010, a memory buffer 1020, an error correction code (ECC) circuit 1030, a host Interface 1040, a buffer control circuit 1050, a memory interface 1060, and a bus 1070.

The bus 1070 may provide a channel between the components of the memory controller 1000.

The processor 1010 may control the overall operation of the memory controller 1000 and perform a logical operation. The processor 1010 may communicate with the external host through the host interface 1040, and communicate with the memory device through the memory interface 1060. In addition, the processor 1010 may communicate with the memory buffer 1020 through the buffer control circuit 1050. The processor 1010 may control the operation of the storage device using the memory buffer 1020 as an operation memory, a cache memory, or a buffer memory.

The processor 1010 may perform the function of a flash translation layer (FTL). The processor 1010 may translate a logical block address (LBA), provided by the host, into a physical block address (PBA) through the FTL. The FTL may receive the LBA using a mapping table and translate the LBA into the PBA. An address mapping method using the FTL may be modified in various ways depending on the unit of mapping. Representative address mapping methods may include a page mapping method, a block mapping method, and a hybrid mapping method.

The processor 1010 may randomize data received from the host. For example, the processor 1010 may use a randomizing seed to randomize data received from the host. Randomized data may be provided to the memory device as data to be stored, and may be programmed to the memory cell array.

During a read operation, the processor 1010 may derandomize data received from the memory device. For example, the processor 1010 may use a derandomizing seed to derandomize data received from the memory device. Derandomized data may be output to the host.

In an embodiment, the processor 1010 may drive software or firmware to perform the randomizing operation or the derandomizing operation.

In an embodiment, the processor 1010 may perform the operation of the growing defect processing unit 210 described with reference to FIGS. 1, 13, and 14.

The memory buffer circuit 1020 may be used as an operation memory, a cache memory, or a buffer memory of the processor 1010. The memory buffer circuit 1020 may store codes and commands to be executed by the processor 1010. The memory buffer circuit 1020 may store data to be processed by the processor 1010. The memory buffer 1020 may include a static RAM (SRAM) or a dynamic RAM (DRAM).

The ECC circuit 1030 may perform error correction. The ECC circuit 1030 may perform an ECC encoding operation based on data to be written to the memory device 100 through the memory interface 1060. ECC encoded data may be transmitted to the memory device 100 through the memory interface 1060. The ECC circuit 1030 may perform an ECC decoding operation on data received from the memory device 100 through the memory interface 1060. For example, the ECC circuit 1030 may be included in the memory interface 1060 as a component of the memory interface 1060.

The host interface 1040 may communicate with the external host under control of the processor 1010. The host interface 1040 may perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), multiMedia card (MMC), an embedded MMC (eMMC), a dual in-line memory module (DIMM), a registered DIMM (RDIMM), and a load reduced DIMM (LRDIMM) communication methods.

The buffer control circuit 1050 may control the memory buffer 1020 under control of the processor 1010.

The memory interface 1060 may communicate with the memory device 100 under control of the processor 1010. The memory interface 1060 may communicate a command, an address, and data with the memory device 100 through the channel.

For example, the memory controller 1000 may include neither the memory buffer 1020 nor the buffer control circuit 1050.

For example, the processor 1010 may use codes to control the operation of the memory controller 1000. The processor 1010 may load codes from a nonvolatile memory device (e.g., a read only memory) provided in the memory controller 1000. Alternatively, the processor 1010 may load codes from the memory device through the memory interface 1060.

For example, the bus 1070 of the memory controller 1000 may be divided into a control bus and a data bus. The data bus may transmit data in the memory controller 1000. The control bus may transmit control information such as a command and an address in the memory controller 1000. The data bus and the control bus may be separated from each other and may neither interfere with each other nor affect each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 19:
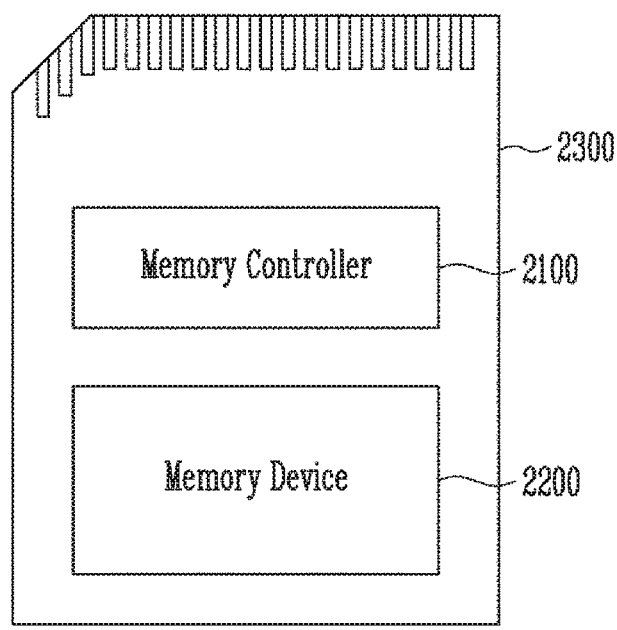
FIG. 19 is a block diagram illustrating a memory card system to which a storage device in accordance with an embodiment of the present disclosure is applied.

FIG. 19 is a block diagram illustrating a memory card system 2000 to which a storage device in accordance with an embodiment of the present disclosure is applied.

Referring FIG. 19, the memory card system 2000 may include a memory controller 2100, a memory device 2200 and a connector 2300.

The memory controller 2100 is coupled to the memory device 2200. The memory controller 2100 may access the memory device 2200. For example, the memory controller 2100 may control a read operation, a write operation, an erase operation, and a background operation of the memory device 2200. The memory controller 2100 may provide an interface between the memory device 2100 and the host. The memory controller 2100 may drive firmware for controlling the memory device 2200. The memory controller 2100 may be embodied in the same manner as that of the memory controller 200 described with reference to FIG. 1.

In an embodiment, the memory controller 2100 may include components such as a random access memory (RAM), a processing unit, a host interface, and a memory interface, and an ECC circuit.

The memory controller 2100 may communicate with an external device through the connector 2300. The memory controller 2100 may communicate with an external device (e.g., a host) based on a specific communication protocol. In an embodiment, the memory controller 2100 may communicate with the external device through at least one of various communication protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) protocols. In an embodiment, the connector 2300 may be defined by at least one of the above-described various communication protocols.

In an embodiment, the memory device 2200 may be implemented as any of various nonvolatile memory devices, such as an electrically erasable and programmable ROM (EEPROM), a NAND flash memory, a NOR flash memory, a phase-change RAM (PRAM), a resistive RAM (ReRAM), a ferroelectric RAM (FRAM), and a spin-torque magnetic RAM (STT-MRAM).

The operation of the growing defect processing unit 210 described with reference to FIGS. 1, 13, and 14 may be performed by the memory controller 2100.

For example, the memory controller 2100 or the memory device 2200 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP), and may be provided as a single semiconductor package. Alternatively, the memory device 2200 may include a plurality of nonvolatile memory chips, and the plurality of nonvolatile memory chips may be packaged based on the above-mentioned package methods and provided as a single semiconductor package.

For example, the memory controller 2100 and the memory device 2200 may be integrated into a single semiconductor device. For example, the memory controller 2100 and the memory device 2200 may be integrated into a single semiconductor device to form a solid state drive (SSD). In an embodiment, the memory controller 2100 and the memory device 2200 may be integrated into a single semiconductor device to form a memory card. For example, the memory controller 2100 and the memory device 2200 may be integrated into a single semiconductor device to form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

For example, the memory device 2200 may be the memory device 100 described with reference to FIG. 1.

Figure 20:
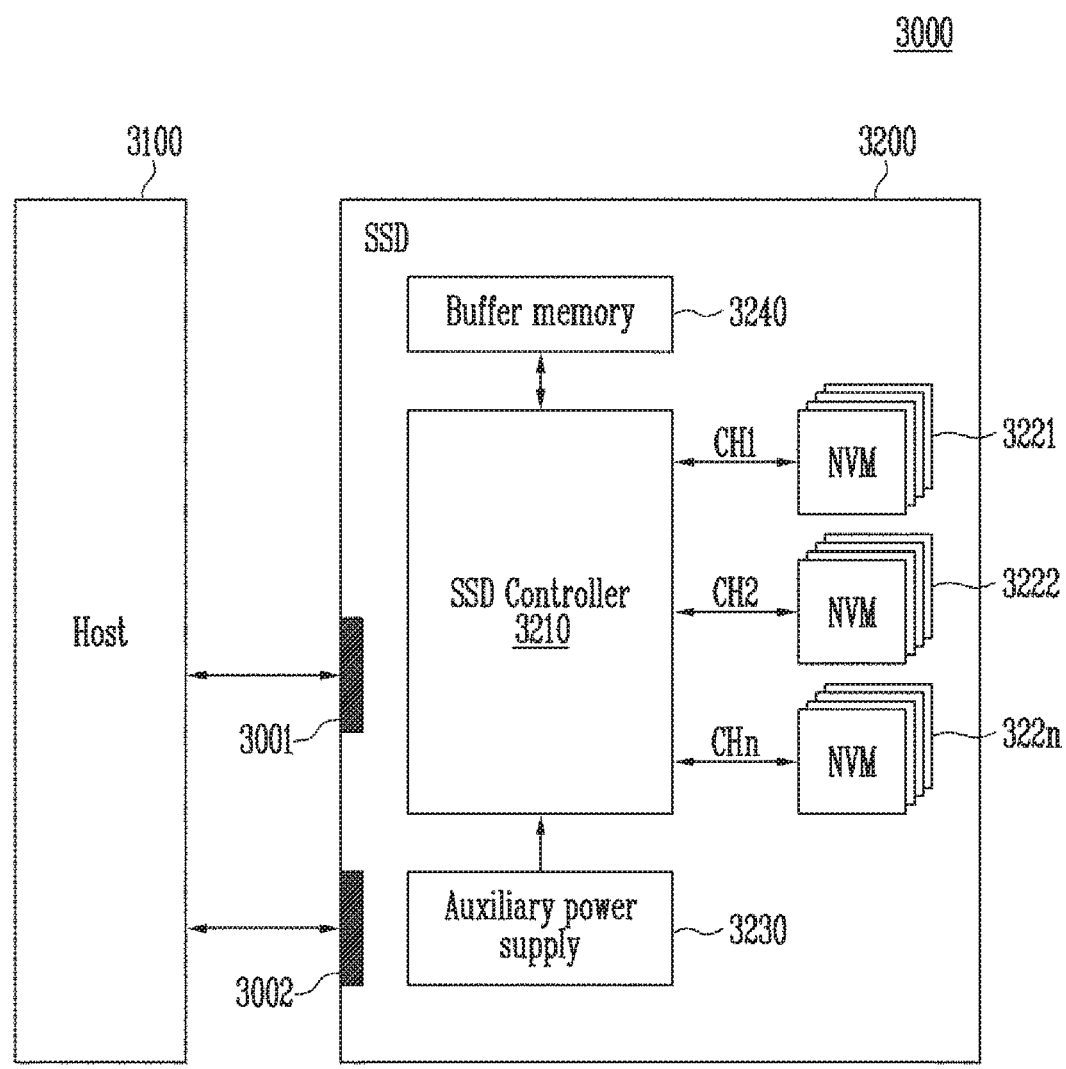
FIG. 20 is a block diagram illustrating a solid state drive (SSD) system to which a storage device in accordance with an embodiment of the present disclosure is applied.

FIG. 20 is a block diagram illustrating a solid state drive (SSD) system 3000 to which a storage device in accordance with an embodiment of the present disclosure is applied.

Referring to FIG. 20, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may perform the function of the memory controller 200, described above with reference to FIG. 1.

The SSD controller 3210 may control the plurality of flash memories 3221 to 322n in response to the signals SIG received from the host 3100. In an embodiment, the signals SIG may be signals based on an interface between the host 3100 and the SSD 3200. For example, the signals SIG may be signals defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer small interface (SCSI), enhanced small disk interface (ESDI), integrated drive electronics (IDE), Firewire, universal flash storage (UFS), Wi-Fi, Bluetooth, and nonvolatile memory express (NVMe) interfaces.

The auxiliary power supply 3230 may be coupled to the host 3100 through the power connector 3002. The auxiliary power supply 3230 may be supplied with power PWR from the host 3100, and may be charged by the power PWR. The auxiliary power supply 3230 may supply the power of the SSD 3200 when the supply of power from the host 3100 is not smoothly performed. In an embodiment, the auxiliary power supply 3230 may be positioned inside the SSD 3200 or positioned outside the SSD 3200. For example, the auxiliary power supply 3230 may be disposed in a main board and may supply auxiliary power to the SSD 3200.

The buffer memory 3240 functions as a buffer memory of the SSD 3200. For example, the buffer memory 3240 may temporarily store data received from the host 3100 or data received from the plurality of flash memories 3221 to 322n or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

For example, each of the nonvolatile memory devices 3221 to 322n may be the memory device 100 described with reference to FIG. 1.

Figure 21:
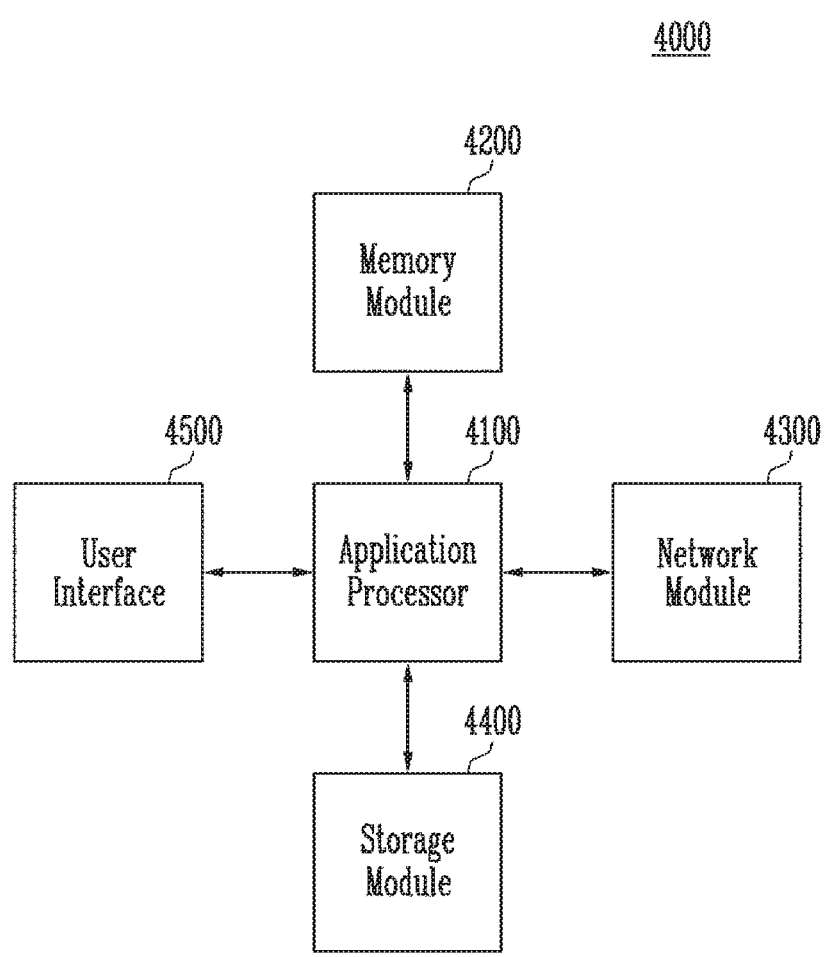
FIG. 21 is a block diagram illustrating a user system to which a storage device in accordance with an embodiment of the present disclosure is applied.

FIG. 21 is a block diagram illustrating a user system 4000 to which a storage device in accordance with an embodiment of the present disclosure is applied.

Referring to FIG. 21, the user system 4000 may include an application processor 4100, a memory module 4200, a network module 4300, a storage module 4400, and a user interface 4500.

For example, the application processor 4100 may run components included in the user system 4000, an operating system (OS) or a user program. In an embodiment, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include a volatile RAM such as a DRAM, an SDRAM, a DDR SDRAM, a DDR2 SDRAM, a DDR3 SDRAM, an LPDDR SDARM, and an LPDDR3 SDRAM, or a nonvolatile RAM such as a PRAM, a ReRAM, an MRAM, and an FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as code division multiple access (CDMA), global system for mobile communication (GSM), wideband CDMA (WCDMA), CDMA-2000, time division multiple access (TDMA), long term evolution (LTE), WiMAX, WLAN, UWB, Bluetooth, or WI-FI communication. In an embodiment, the network module 4300 may be included in the application processor 4100.

The storage module 4400 may store data therein. For example, the storage module 4400 may store data received from the application processor 4100. Alternatively, the storage module 4400 may transmit the data stored in the storage module 4400 to the application processor 4100. In an embodiment, the storage module 4400 may be implemented as a nonvolatile semiconductor memory device, such as a phase-change RAM (PRAM), a magnetic RAM (MRAM), a resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 400.

In an embodiment, the storage module 4400 may include a plurality of nonvolatile memory devices, and each of the plurality of nonvolatile memory devices may be the memory device 100 described above with reference to FIG. 1.

The user interface 4500 may include interfaces for inputting data or instructions to the application processor 4100 or outputting data to an external device. In an embodiment, the user interface 4500 may Include user input Interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a liquid crystal display (LCD), an organic light emitting diode (OLED) display device, an active matrix OLED (AMOLED) display device, an LED, a speaker, and a motor.

As described above, various embodiments of the present disclosure may provide a storage device capable of detecting a region where the probability of occurrence of a growing defect is present, and a method of operating the storage device.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

Although the embodiments of the present disclosure have been disclosed, those skilled in the art will appreciate that various modifications, additions and substitutions are possible, without departing from the scope and spirit of the present disclosure.

In the above-discussed embodiments, all steps may be selectively performed or skipped. In addition, the steps in each embodiment may not always be sequentially performed in given order, and may be randomly performed. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A memory device comprising:
    a memory cell array including a plurality of memory cells;
    a peripheral circuit configured to perform a program operation on selected memory cells among the plurality of memory cells; and
    a program pulse information generating unit configured to generate program pulse information indicating whether a number of program pulses applied to the selected memory cells during the program operation has exceeded a reference value,
    wherein the memory device outputs the program pulse information in response to a command received from an external controller.

2. The memory device according to claim 1, wherein the program pulse information generating unit stores the generated program pulse information in a status register.

3. The memory device according to claim 1, wherein the reference value is a value less than a maximum program pulse count that is the number of program pulses when the program operation is determined to having failed.

4. The memory device according to claim 2,
    wherein the status register stores status information indicating a status of the memory device, and
    wherein the status information includes ready information for indicating that reception of a new command is possible and an operation corresponding to a previously received command has been completed, the program pulse information, and fail information for indicating that an operation corresponding to a performed command has failed.

5. The memory device according to claim 4, wherein the program pulse information is set when the number of program pulses applied to the selected memory cells during the program operation exceeds the reference value, and is released when the number of program pulses applied to the selected memory cells during the program operation is equal to or does not exceed the reference value.

6. The memory device according to claim 1, further comprising a program pulse information storage unit configured to store the program pulse information,
    wherein the program pulse information storage unit comprises a static random access memory.

7. The memory device according to claim 2, wherein the memory device outputs the program pulse information stored in the status register, and
    wherein the command is a status read command.

8. The memory device according to claim 6, wherein the memory device outputs the program pulse information stored in the program pulse information storage unit, and
    wherein the command is a get parameter command.

9. A method for operating a memory controller, comprising:
    providing a program command corresponding to a program operation to a memory device;
    providing a status read command to the memory device when a preset time passes after the program command is provided;
    receiving a status read response output from the memory device in response to the status read command; and determining whether a probability of a growing defect occurring in a memory region on which the program operation has been performed is present, based on program pulse information included in the status read response.

10. The method according to claim 9, wherein the program pulse information is information indicating whether a number of program pulses applied to the memory region during the program operation exceeds a reference value.

11. The method according to claim 10, wherein the program pulse information is set when the number of program pulses applied to selected memory cells during the program operation exceeds the reference value, and is released when the number of program pulses applied to the selected memory cells during the program operation is equal to or does not exceed the reference value.

12. The method according to claim 11, wherein the determining comprises:
reading data stored in the memory region; and
determining whether the probability of the growing defect occurring in the memory region is present depending on a result of the reading.

13. The method according to claim 12, wherein the determining whether the probability of the growing defect occurring in the memory region is present depending on the result of the reading comprises setting a memory block including the memory region as a growing bad block candidate when the result of the reading is a pass.

14. The method according to claim 12, wherein the determining whether the probability of the growing defect occurring in the memory region is present depending on the result of the reading comprises setting data stored in the memory region as invalid data when the result of the reading is a fail, and re-performing the program operation on a memory region different from the memory region on which the program operation has been performed.

15. The method according to claim 13, wherein the memory region corresponding to the growing bad block candidate is set as a read-only region, allowing only a read operation to be performed thereon.

16. The method according to claim 9, wherein the status read command is a command for requesting a value of a status register stored in the memory device.

17. The method according to claim 16,
wherein the status read response includes status information of the memory device, and
wherein the status information includes ready information for indicating that reception of a new command is possible and an operation corresponding to a previously received command has been completed, the program pulse information, and fail information for indicating that an operation corresponding to a performed command has failed.

18. The method according to claim 10, wherein the reference value is a value less than a maximum program pulse count that is the number of program pulses when the program operation is determined to having failed.

19. A storage device comprising:
a memory device configured to store program pulse information indicating whether a number of program pulses applied to memory cells during a program operation exceeds a reference value; and
a memory controller configured to provide a read command for a read operation on selected memory cells to the memory device based on the program pulse information, and determine whether a probability of a growing defect occurring in the selected memory cells is present depending on a result of the read operation.

20. The storage device according to claim 19, wherein the reference value is a value less than a maximum program pulse count that is the number of program pulses when the program operation is determined to having failed.

* * * * *